United States Patent
Kim et al.

(10) Patent No.: US 11,183,557 B2
(45) Date of Patent: Nov. 23, 2021

(54) DISPLAY DEVICE, TILING DISPLAY DEVICE AND METHOD OF MANUFACTURING THE SAME

(71) Applicant: LG Display Co., Ltd., Seoul (KR)

(72) Inventors: HanSeok Kim, Paju-si (KR); YoungHo Kim, Gwangju (KR)

(73) Assignee: LG DISPLAY CO., LTD., Seoul (KR)

( * ) Notice: Subject to any disclaimer, the term of this patent is extended or adjusted under 35 U.S.C. 154(b) by 11 days.

(21) Appl. No.: 16/711,176

(22) Filed: Dec. 11, 2019

(65) Prior Publication Data
US 2020/0194539 A1    Jun. 18, 2020

(30) Foreign Application Priority Data

Dec. 14, 2018  (KR) .................. 10-2018-0161810

(51) Int. Cl.
| | | |
|---|---|---|
| H01L 27/32 | (2006.01) | |
| H01F 7/02 | (2006.01) | |
| H01L 51/52 | (2006.01) | |
| H01L 51/56 | (2006.01) | |

(52) U.S. Cl.
CPC .......... *H01L 27/3293* (2013.01); *H01F 7/02* (2013.01); *H01L 51/5237* (2013.01); *H01L 51/56* (2013.01)

(58) Field of Classification Search
CPC . G06F 3/1446; G06F 1/1647; H01L 27/3293; H01L 51/5237; H01L 51/56; G02F 1/13336; G09F 9/3026; H01F 7/02; H01F 7/0252; G09G 2300/026
USPC ........................................................ 257/40
See application file for complete search history.

(56) References Cited

U.S. PATENT DOCUMENTS

| | | | | |
|---|---|---|---|---|
| 2009/0250575 | A1* | 10/2009 | Fullerton | ............... G09F 7/04 248/206.5 |
| 2011/0001025 | A1* | 1/2011 | Fiedler | ............... B62J 11/00 248/206.5 |
| 2014/0003052 | A1* | 1/2014 | Hemiller | ............... F21V 21/34 362/249.02 |
| 2016/0210886 | A1* | 7/2016 | Brashnyk | ............... G09F 9/33 |
| 2017/0159876 | A1* | 6/2017 | Brashnyk | ............... F16M 11/18 |

(Continued)

FOREIGN PATENT DOCUMENTS

| | | |
|---|---|---|
| CN | 1647016 A | 7/2005 |
| CN | 101939801 A | 1/2011 |
| CN | 104584106 A | 4/2015 |

(Continued)

OTHER PUBLICATIONS

Office Action dated May 28, 2021 issued in Chinese Patent Application No. 201911174038.X w/English Translation (11 pages).

*Primary Examiner* — Jonathan Han
(74) *Attorney, Agent, or Firm* — Polsinelli PC

(57) ABSTRACT

The present disclosure relates to a display device, a tiling display device, and a method of manufacturing a tiling display device and the display device according to an aspect of the present disclosure includes: a display panel; a metal plate disposed on a rear side of the display panel; a plurality of magnets disposed on a rear side of the metal plate; and a plurality of ferromagnetic materials disposed on both side of the plurality of magnets. Therefore, the plurality of magnets and the plurality of ferromagnetic materials are used to easily attach and detach the display device and install, maintain, and repair the display device.

18 Claims, 20 Drawing Sheets

(56) References Cited

U.S. PATENT DOCUMENTS

2018/0031919 A1* 2/2018 Ryu ..................... G09F 9/3026

FOREIGN PATENT DOCUMENTS

| CN | 106463083 A | 2/2017 |
| CN | 107690683 A | 2/2018 |
| CN | 108323163 A | 7/2018 |
| CN | 108766271 A | 11/2018 |
| CN | 108986679 A | 12/2018 |
| KR | 10-1712620 B1 | 3/2017 |
| KR | 10-2017-0143034 A | 12/2017 |
| KR | 10-2018-0011983 A | 2/2018 |
| KR | 10-1895522 B1 | 10/2018 |

* cited by examiner

DISPLAY DEVICE, TILING DISPLAY DEVICE AND METHOD OF MANUFACTURING THE SAME

CROSS-REFERENCE TO RELATED APPLICATION

This application claims the priority of Korean Patent Application No. 10-2018-0161810 filed on Dec. 14, 2018, which is hereby incorporated by reference in its entirety.

BACKGROUND

Field of the Disclosure

The present disclosure relates to a display device, a tiling display device, and a method of manufacturing the same, and more particularly, to a display device which is easily attachable and aligned at the time of a tiling work, a tiling display device, and a method of manufacturing the same.

Description of the Background

As display devices which are used for a monitor of a computer, a television, a cellular phone, or the like, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

In the meantime, recently, a tiling display device in which a plurality of display devices is connected to increase a display area is used as a billboard.

SUMMARY

First, a display device is used from a small size electronic apparatus used for mobile phones to a large size electronic apparatus such as a large-size TV. As described above, the display device is manufactured from a small size to a large size of several tens of inches to be used for various purposes. However, it is technically difficult to manufacture a display device with a very large size of several hundreds of inches or larger so that a tiling display device in which a plurality of display devices is connected to increase a display area is used. Further, the tiling display device configured by a plurality of display devices is attached to a surface of a wall to be used as a billboard or a large electric signboard of a stadium or an outdoor advertising signboard.

Such a tiling display device may be implemented such that a mechanism for fixing is disposed on rear surfaces of the plurality of display devices and the mechanism is fastened with the wall portion. However, during the process of using the mechanism disposed on the rear surface of the display device, an operator is located behind the wall portion to perform the fastening process. Therefore, there is a problem that a space for the operator to work needs to be necessarily ensured behind the wall portion. Further, when the mechanism is used, there may be a mechanism tolerance and it may be difficult to precisely dispose the plurality of display devices on the wall portion. If the plurality of display devices is deviated, a boundary area between the plurality of display devices where images are not displayed is visibly recognized, so that a quality of the image is degraded.

Therefore, inventors of the present disclosure invented a method that a work of tiling a plurality of display devices is also performed in front of the display device and when a deviation between the plurality of display devices is found during the tiling process, intervals and arrangement between the plurality of display devices can be realigned without disassembling and reassembling the plurality of display devices.

Therefore, the present disclosure provides a display device, a tiling display device, and a method of manufacturing the same which may easily adjust intervals between a plurality of display devices attached onto a wall portion.

Also, the present disclosure provides a display device, a tiling display device, and a method for manufacturing the same in which a process of tiling a plurality of display devices is performed in front of the display device so that a space behind the wall portion does not need to be ensured.

Further, the present disclosure provides a display device, a tiling display device, and a method of manufacturing the same which can minimize the damage of adjacent display devices due to the impact during a process of aligning a plurality of display devices.

According to an aspect of the present disclosure, a display device includes a display panel; a metal plate disposed on a rear surface of the display panel; a plurality of magnets disposed on a rear surface of the metal plate; and a plurality of ferromagnetic materials disposed on both side surfaces of the plurality of magnets. Therefore, the plurality of magnets and the plurality of ferromagnetic materials are used to more easily attach and detach the display device and install, maintain, and repair the display device.

In order to solve the above-described problems, according to another aspect of the present disclosure, a tiling display device may be implemented by disposing a plurality of display devices described above.

The present disclosure is not limited to the above-mentioned aspects, which are not mentioned above, can be clearly understood by those skilled in the art from the following descriptions.

According to another aspect of the present disclosure, a method of manufacturing a tiling display device includes: attaching a mounting jig including a plurality of jig magnets to a display device including a plurality of panel magnets and a plurality of panel ferromagnetic materials; bring the display device into contact with a wall portion using the mounting jig; and detaching the mounting jig from the display device. Therefore, during the process of tiling the display device, the magnetic fields between the mounting jig and the display device and between the display device and the wall portion are controlled to more precisely and easily align the display devices.

Other detailed matters of the exemplary aspects are included in the detailed description and the drawings.

According to the present disclosure, it is possible to easily adjust the interval and deviation between the plurality of display devices without disassembling the plurality of display devices.

According to the present disclosure, it is possible to control the arrangement of the respective display devices in front of the plurality of display devices.

In a tiling display device of the present disclosure configured by a plurality of display devices, installation, maintenance, and repairing of each of the plurality of display devices may be easily performed.

According to the present disclosure, the interval between the plurality of display devices is minimized to minimize the degradation of an immersion level by the boundary area between the plurality of display devices at the time of viewing the images.

According to the present disclosure, when the plurality of display devices is aligned, the damage caused when the adjacent display devices collide with each other may be minimized.

According to the present disclosure, a shape and a structure of a wall portion may be simplified.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
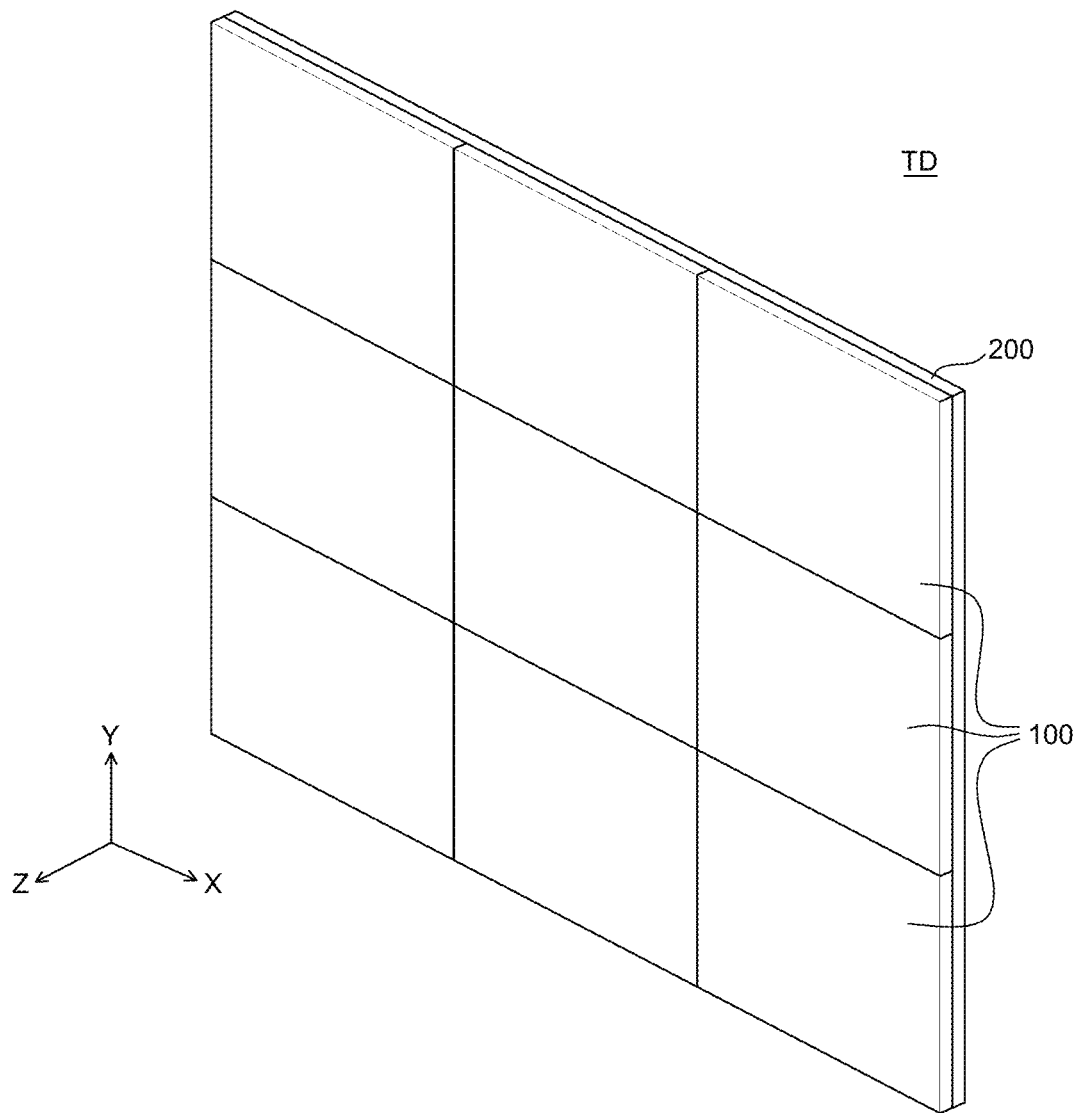
FIG. 1 is a perspective view of a tiling display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a perspective view of a tiling display device according to an exemplary aspect of the present disclosure. Referring to FIG. 1, a tiling display device TD according to an exemplary aspect of the present disclosure is formed by connecting a plurality of display devices 100 according to an exemplary aspect of the present disclosure.

Referring to FIG. 1, the tiling display device TD according to one exemplary aspect of the present disclosure includes a plurality of display devices 100 and a wall portion 200. The tiling display device TD is implemented by disposing the plurality of display devices 100 to increase a display area where the images are displayed.

Each of the plurality of display devices 100 is attached to the wall portion 200 to be disposed as if it is one display device. For example, the plurality of display devices 100 is attached on the wall portion 200 in the form of tiles to implement the tiling display device TD. In this case, even though not illustrated in the drawing, various wiring lines, cables, and the like, which electrically connect each of the plurality of display devices 100 may be disposed on the wall portion 200 and the plurality of display devices 100 may be driven as one display device. Further, the plurality of display devices 100 may be electrically connected by a wireless communication manner without using a separate wiring line or cable.

In the meantime, since the tiling display device TD has a very large size, it is difficult to move the plurality of display devices 100 in a connected state to an installation location. Therefore, the plurality of display devices 100 moves to the installation location and then the plurality of display devices 100 may be assembled as the tiling display device TD in the installation location.

When the plurality of display devices 100 is attached to the wall portion 200, the plurality of display devices 100 may be attached as close as possible such that the interval between the plurality of display devices 100 is constant and minimized. Therefore, the plurality of display devices 100 looks like one display device 100. That is, the plurality of display devices 100 is precisely aligned to be attached to the wall portion 200 so that a boundary area where the images are not displayed may be minimized.

In this case, the plurality of display devices 100 is aligned in an X axis direction, a Y axis direction, and a Z axis direction to be attached to the wall portion 200. When the plurality of display devices 100 is aligned in the X axis direction, a left edge and a right edge of the plurality of display devices 100 disposed in the same column may be disposed in a straight line. Further, when the plurality of display devices 100 is aligned in the Y axis direction, an upper edge and a lower edge of the plurality of display devices 100 disposed in the same row may be disposed in a straight line. Further, when the plurality of display devices 100 is aligned in the Z axis direction, the overall front surfaces of the plurality of display devices 100 may be disposed on one plane to remove steps between the plurality of display devices 100.

When the arrangement between the plurality of display devices 100 is deviated in any one of the X axis direction, the Y axis direction, and the Z axis direction, the boundary area between the plurality of display devices 100 where the images are not displayed may be visibly recognized by the user. When the boundary area is visibly recognized by the user, immersion may be interfered when the user views the image and it may be difficult to implement a clear image.

Therefore, when the plurality of display devices 100 is attached to the wall portion 200, it is important to align the plurality of display devices 100 in the X axis direction, the Y axis direction, and the Z axis direction. However, a minute deviation between the plurality of display devices 100 may be caused due to an error or a mechanism tolerance generated during the process of attaching the plurality of display devices 100 by an operator. In the tiling display device TD according to one exemplary aspect of the present disclosure, in a state that the plurality of display devices 100 is attached to the wall portion 200, a minute deviation in the X axis direction and the Y axis direction may also be secondarily aligned.

Figure 2:
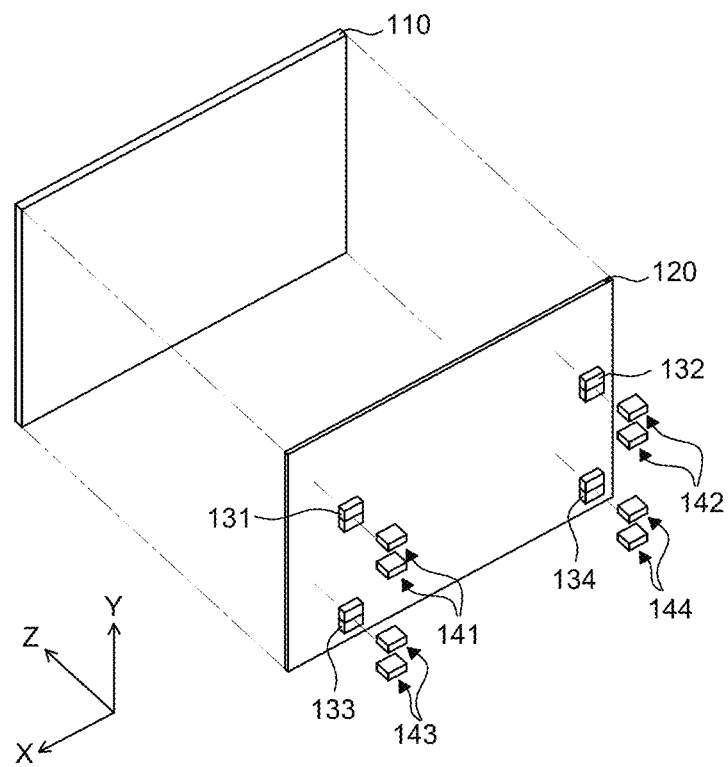
FIG. 2 is an exploded perspective view of a display device according to an exemplary aspect of the present disclosure.
Figure 3:
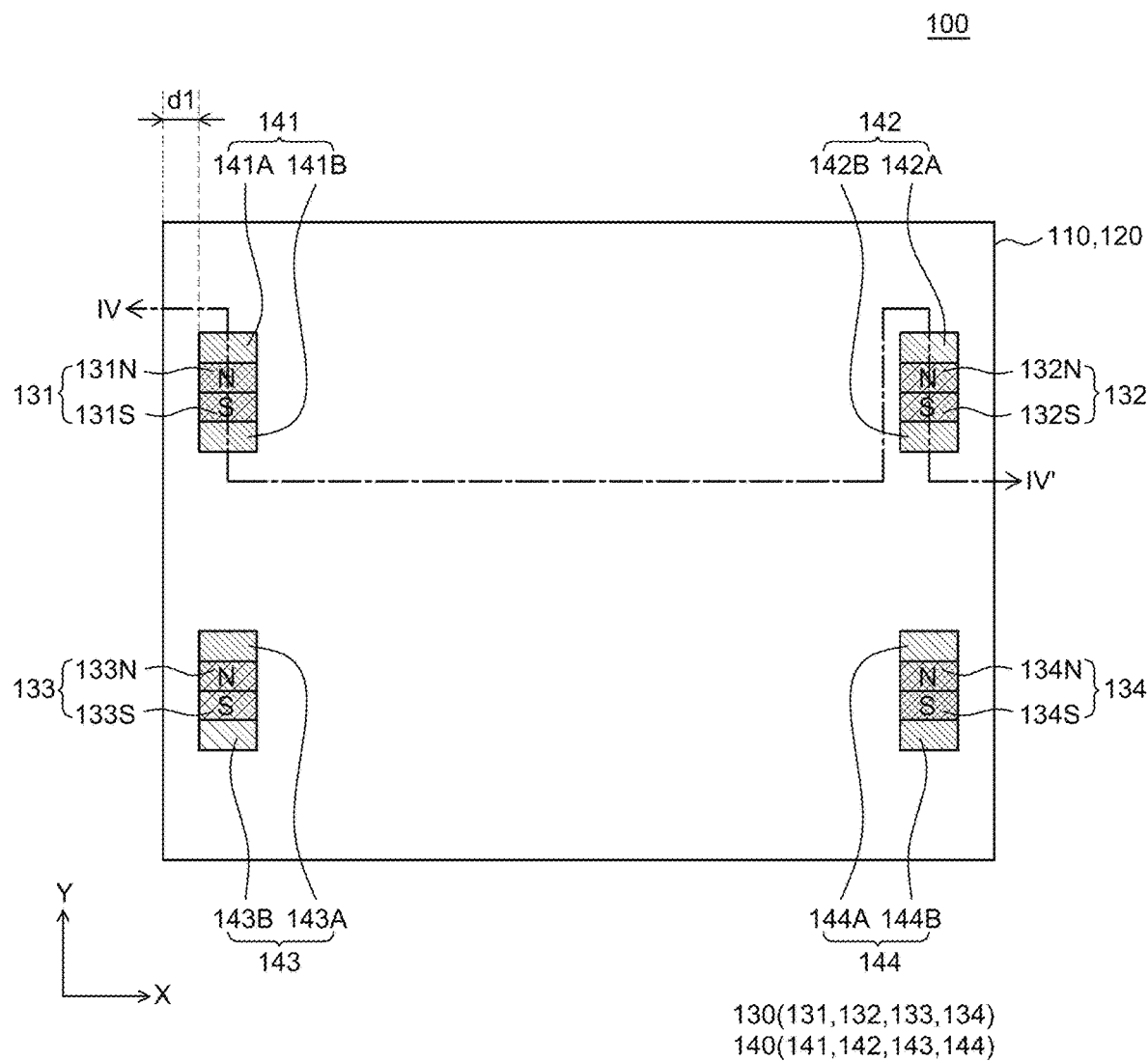
FIG. 3 is a rear view of a display device according to an exemplary aspect of the present disclosure.
Figure 4:
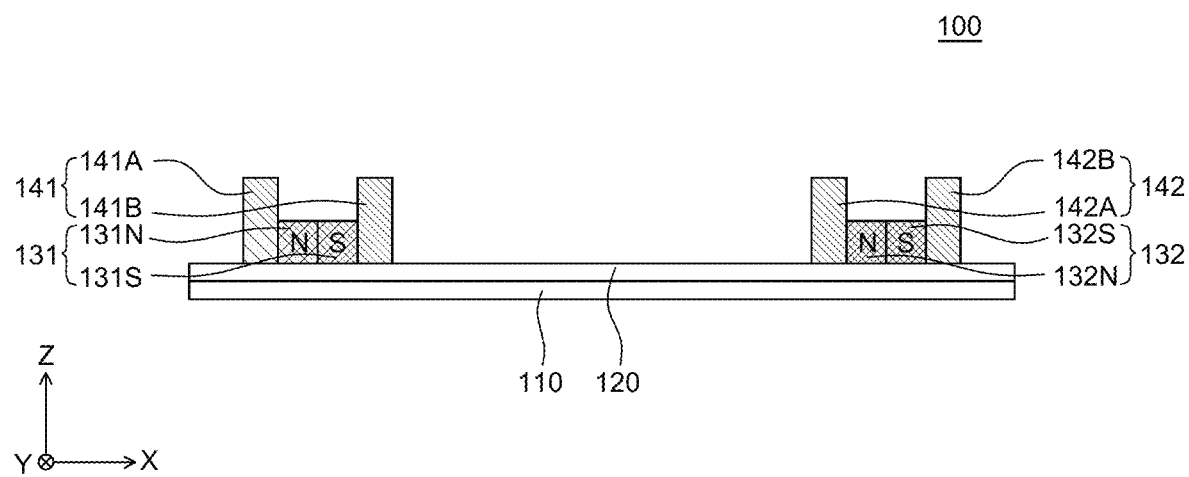
FIG. 4 is a cross-sectional view of a display device taken along the line IV-IV' of FIG. 3.

FIG. 2 is an exploded perspective view of a display device according to an exemplary aspect of the present disclosure. FIG. 3 is a rear view of a display device according to an exemplary aspect of the present disclosure. FIG. 4 is a cross-sectional view of a display device taken along the line IV-IV' of FIG. 3. For the convenience of description, in FIGS. 2 to 4, only one display device among the plurality of display devices 100 of the method of manufacturing a tiling display device is illustrated.

Each of the plurality of display devices 100 is a configuration which displays images and serves as a basic unit of the tiling display device TD. Referring to FIG. 2, each of the plurality of display devices 100 includes a display panel 110, a metal plate 120, a plurality of panel magnets 130, and a plurality of panel ferromagnetic materials 140.

First, the display panel 110 is a configuration for displaying images to a user. In the display panel 110, display elements and circuits, wiring lines, components, and the like, for driving the display elements may be disposed. The display element may be defined in different ways depending on a type of the display panel 110. For example, when the display panel 110 is an organic light emitting display panel, the display element may be an organic light emitting diode which includes an anode, an organic light emitting layer, and a cathode. For example, when the display panel 110 is an inorganic light emitting display panel, the display element may be an LED or a micro LED including an n-type semiconductor layer, a p-type semiconductor layer, and a light emitting layer. However, the display panel is not limited thereto and the display element of the display panel 110 may be configured in various forms.

Referring to FIGS. 2 to 4, the metal plate 120 is disposed on a rear surface of the display panel 110. The metal plate 120 is a configuration which supports and protects the display panel 110 and emits heat generated in the display panel 110. As illustrated in FIG. 4, the metal plate 120 may be in direct contact with the rear surface of the display panel 110 or only a part of the metal plate 120 is in direct contact with the rear surface of the display panel 110 and the other part is spaced apart from the display panel 110. The metal plate 120 may serve as a back cover disposed on the rear surface of the display panel 110 and may be an arbitrary conductive plate of the display panel 110 and the plurality of panel magnets 130. Even though in FIGS. 2 to 4, it is illustrated that the metal plate 120 has the same size as the display panel 110, the metal plate 120 may have a smaller size than the display panel 110.

Referring to FIGS. 2 to 4, the plurality of panel magnets 130 is disposed on the rear surface of the metal plate 120. The plurality of panel magnets 130 are magnets used to attach the display device 100 and a mounting jig 500 to each other or attach the display device 100 and the wall portion 200 to each other. The plurality of panel magnets 130 may be a bar type neodymium (Nd) dipole magnet including one N pole and one S pole, but is not limited thereto. The plurality of panel magnets 130 may be fixed to the rear surface of the metal plate 120 by an adhesive layer or fixed by a separate fixing mechanism. Further, the plurality of panel magnets 130 may not be directly fixed to the metal plate 120, but may be indirectly fixed to the metal plate 120 by being fixed to the plurality of panel ferromagnetic materials 140. Even though in FIGS. 2 to 4, the plurality of panel magnets 130 is disposed on the rear surface of the metal plate 120 to be in contact with each other, it is not limited thereto. Therefore, the plurality of panel magnets 130 may be disposed to be spaced apart from the rear surface of the metal plate 120 or another component may be disposed between the plurality of panel magnets 130 and the metal plate 120. Therefore, the plurality of panel magnets 130 may be disposed between one end of the plurality of panel ferromagnetic materials 140 which is in contact with the rear surface of the metal plate 120 and the other end of the plurality of panel ferromagnetic materials 140. Further, a height of the plurality of panel magnets 130 may be equal to or lower than a height of the plurality of panel ferromagnetic materials 140. However, the plurality of panel magnets 130 may be disposed so as not to protrude from the other end of the plurality of panel ferromagnetic materials 140.

Referring to FIGS. 2 to 4, the plurality of panel magnets 130 includes a first panel magnet 131, a second panel magnet 132, a third panel magnet 133, and a fourth panel magnet 134. Each of the plurality of panel magnets 130 may be disposed to be adjacent to edges of the display panel 110 and the metal plate 120. For example, the first panel magnet 131 and the third panel magnet 133 are disposed to be adjacent to left edges of the display panel 110 and the metal plate 120 and the second panel magnet 132 and the fourth panel magnet 134 are disposed to be adjacent to right edges of the display panel 110 and the metal plate 120. In this case, the first panel magnet 131 and the second panel magnet 132 may be disposed in parallel in the X axis direction and the third panel magnet 133 and the fourth panel magnet 134 may also be disposed in parallel in the X axis direction. That is, the first panel magnet 131 and the second panel magnet 132 and the third panel magnet 133 and the fourth panel magnet 134 may be disposed in parallel to be substantially parallel to the upper edge and the lower edge which are long sides of the display panel 110 and the metal plate 120. Further, the first panel magnet 131 and the third panel magnet 133 may be disposed in parallel in the Y axis direction and the second panel magnet 132 and the fourth panel magnet 134 may also be disposed in parallel in the Y axis direction. That is, the first panel magnet 131 and the third panel magnet 133 and the second panel magnet 132 and the fourth panel magnet 134 may be disposed in parallel to be substantially parallel to the left edge and the right edge which are short sides of the the display panel 110 and the metal plate 120. However, the arrangement position and the number of panel magnets 130 are not limited thereto and may be designed to have a magnetic force enough to fix the display device 100 to the wall portion 200 in consideration of sizes and weights of the display panel 110 and the metal plate 120.

Referring to FIG. 3, the panel magnets 130 disposed in parallel in the X axis direction may be disposed such that the same polarities are parallel. For example, an N pole 131N of the first panel magnet 131 and an N pole 132N of the second panel magnet 132 are disposed to be parallel and an S pole 131S of the first panel magnet 131 and an S pole 132S of the second panel magnet 132 are disposed to be parallel. Therefore, a virtual line connecting the N pole 131N of the first panel magnet 131 and the N pole 132N of the second panel magnet 132 does not cross, but may be substantially parallel to a virtual line connecting the S pole 131S of the first panel magnet 131 and the S pole 132S of the second panel magnet 132. For example, an N pole 133N of the third panel magnet 133 and an N pole 134N of the fourth panel magnet 134 are disposed to be parallel and an S pole 133S of the third panel magnet 133 and an S pole 134S of the fourth panel magnet 134 are disposed to be parallel. Therefore, a virtual line connecting the N pole 133N of the third panel magnet 133 and the N pole 134N of the fourth panel magnet 134 does not cross, but may be substantially parallel to a virtual line connecting the S pole 133S of the third panel magnet 133 and the S pole 134S of the fourth panel magnet 134.

Referring to FIGS. 2 to 4, each of the plurality of panel ferromagnetic materials 140 is disposed on the rear surface of the metal plate 120 and both side surfaces of each of the plurality of panel magnets 130. The plurality of panel ferromagnetic materials 140 includes a first panel ferromagnetic material 141, a second panel ferromagnetic material 142, a third panel ferromagnetic material 143, and a fourth panel ferromagnetic material 144. Further, the first panel ferromagnetic material 141 includes a first portion 141A disposed to be in contact with the N pole 131N of the first panel magnet 131 and a second portion 141B disposed to be in contact with the S pole 131S of the first panel magnet 131. The second panel ferromagnetic material 142 includes a first portion 142A disposed to be in contact with the N pole 132N of the second panel magnet 132 and a second portion 142B disposed to be in contact with the S pole 132S of the second panel magnet 132. The third panel ferromagnetic material 143 includes a first portion 143A disposed to be in contact with the N pole 133N of the third panel magnet 133 and a second portion 143B disposed to be in contact with the S pole 133S of the third panel magnet 133. The fourth panel ferromagnetic material 144 includes a first portion 144A disposed to be in contact with the N pole 134N of the fourth panel magnet 134 and a second portion 144B disposed to be in contact with the S pole 134S of the fourth panel magnet 134. The plurality of panel ferromagnetic materials 140 may be formed of various ferromagnetic materials, and for example, may be formed of steel, but the material is not specifically limited.

Referring to FIG. 3, a distance d1 between each of the plurality of panel magnets 130 and left edges and right edges of the display panel 110 and the metal plate 120 may be 10 mm or smaller. When the wall portion 200 has a curved shape, even though the plurality of display panels 110 is aligned to be adjacent thereto as much as possible, there may be a space between the display panels 110 due to the step of the wall portion 200. The display device 100 and the wall portion 200 are attached by the panel magnet 130 and the panel ferromagnetic material 140. Therefore, when the panel magnet 130 and the panel ferromagnetic material 140 are excessively spaced apart from the left edge and the right edge, the display panel 110 is spaced in the Z axis direction to cause the space, which may be visibly recognized by the user. Therefore, the distance d1 between each of the plurality of panel magnets 130 and the left edge and the right edge of the display panel 110 and the metal plate 120 is set to be 10 mm or smaller, to minimize the space between the display panels 110.

Hereinafter, prior to description of a process of tiling the display device 100 which has been described with reference to FIGS. 2 to 4, a mounting jig 500 used for tiling will be described with reference to FIGS. 5A to 5C.

Figure 5A:
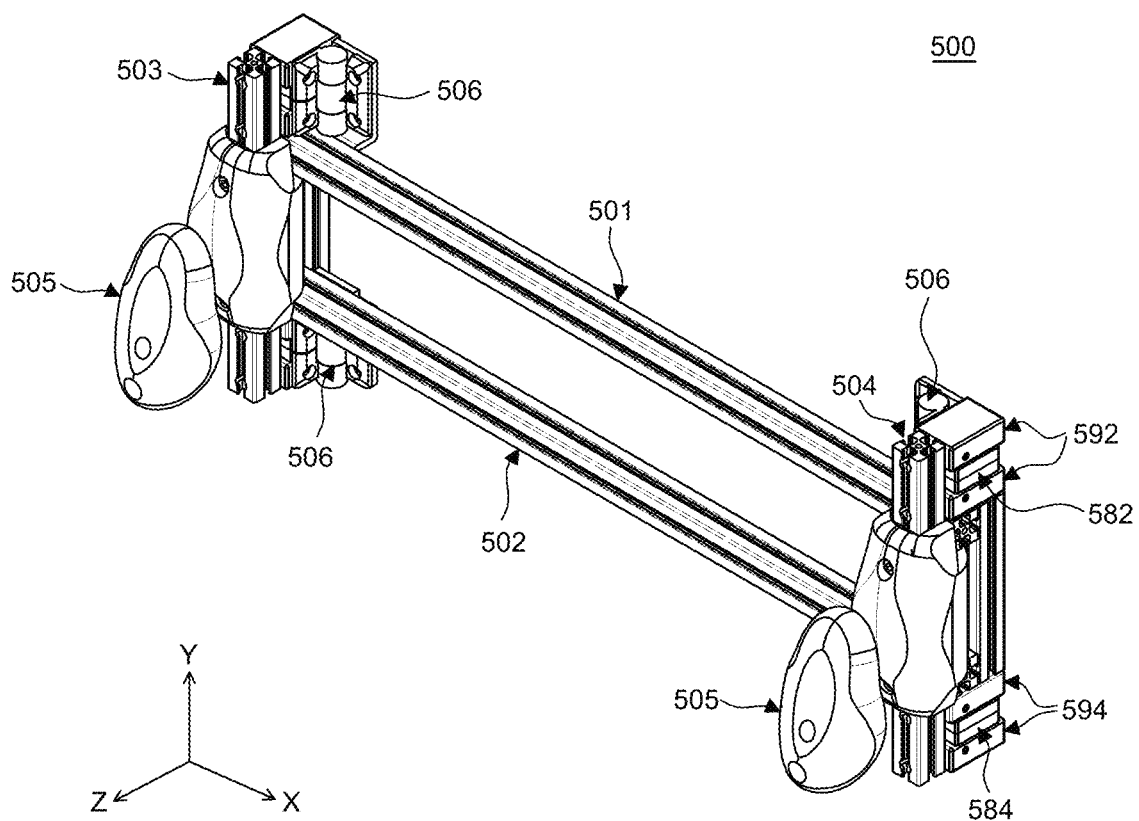
FIGS. 5A to 5C are perspective views for explaining a mounting jig used for a method of manufacturing a tiling display device according to an exemplary aspect of the present disclosure.
Figure 5B:
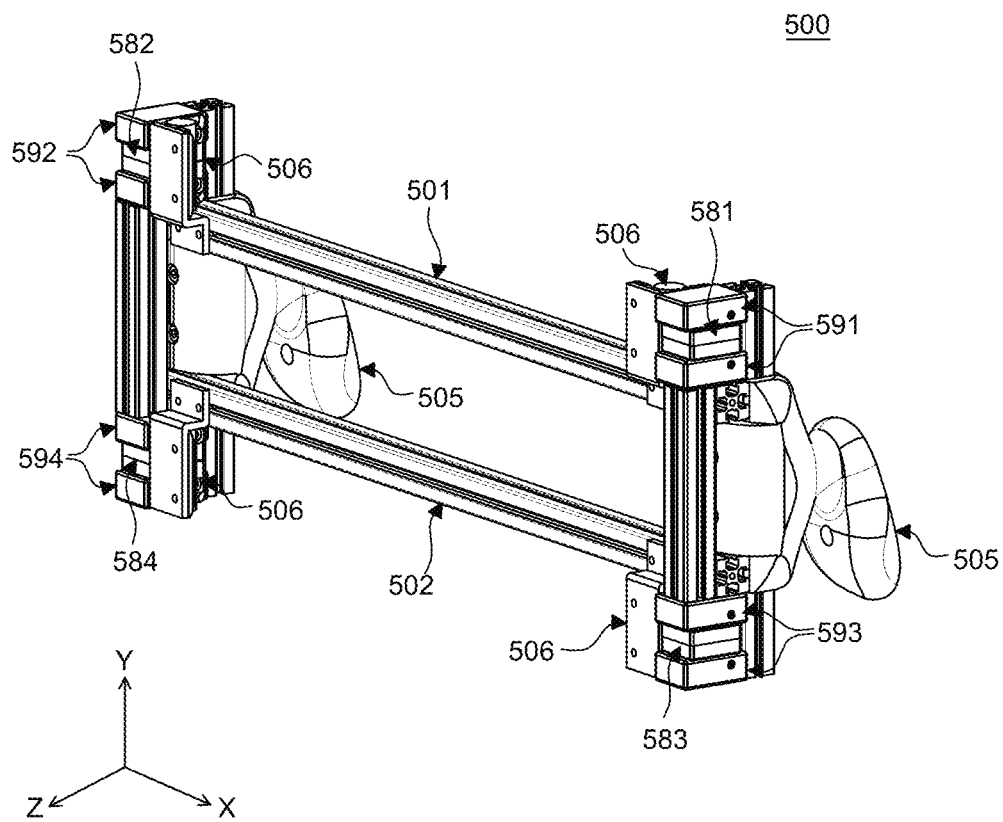
Figure 5C:
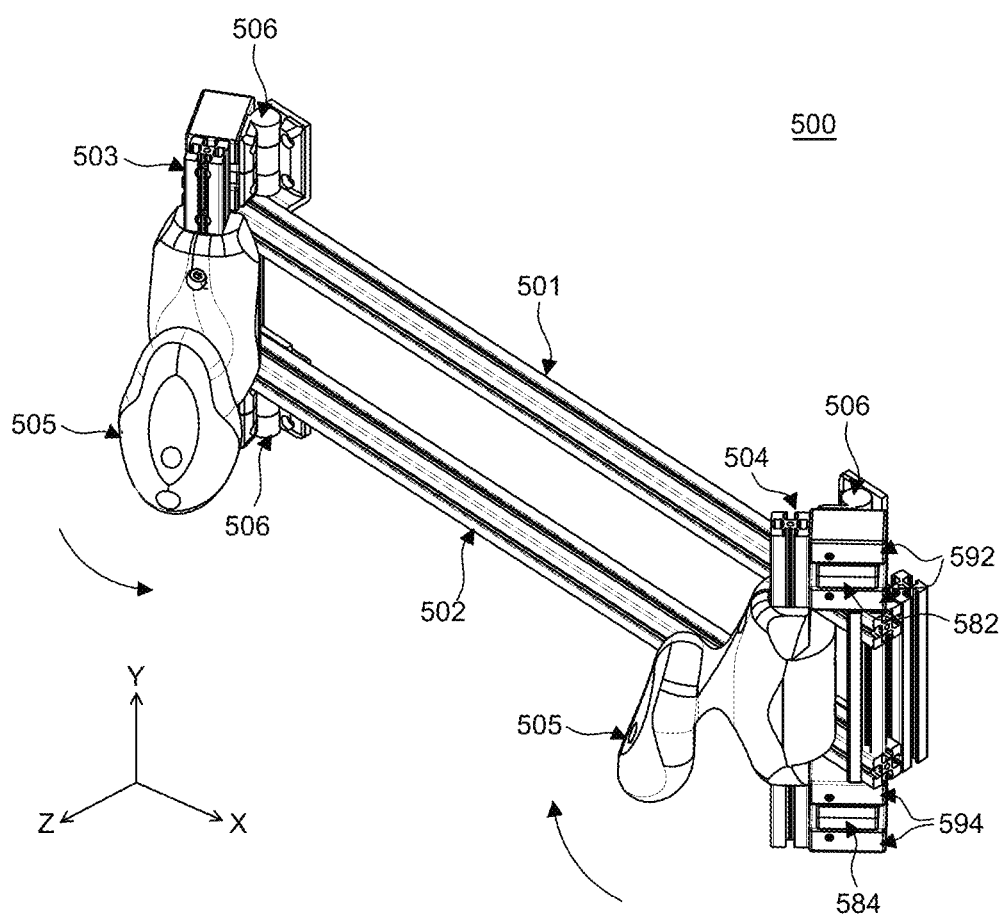

FIGS. 5A to 5C are perspective views for explaining a mounting jig used for a method of manufacturing a tiling display device according to an exemplary aspect of the present disclosure. FIGS. 5A and 5C are perspective views seen from a front surface and a side surface and FIG. 5B is a perspective view seen from a rear surface and a side surface.

Referring to FIGS. 5A to 5C, the mounting jig 500 includes a first support unit 501, a second support unit 502, a third support unit 503, a fourth support unit 504, a handle 505, a hinge structure 506, a plurality of jig magnets 580, and a plurality of jig ferromagnetic materials 590.

The first support unit 501, the second support unit 502, the third support unit 503, and the fourth support unit 504 are structures for supporting the mounting jig 500 and may be implemented in the form of a frame. The first support unit 501 and the second support unit 502 are support units extending in the X axis direction and the third support unit 503 and the fourth support unit 504 are support units extending in the Y axis direction. The first support unit 501, the second support unit 502, the third support unit 503, and the fourth support unit 504 are formed of a material having a rigidity, and for example, may be formed of a metal material or a plastic material, but are not limited thereto. Even though in FIGS. 5A to 5C, it is described that the mounting jig 500 is configured by four support units 501, 502, 503, and 504 extending in the X axis direction or the Y axis direction, as long as a structure supports the mounting jig 500, it is not limited thereto.

Referring to FIGS. 5A to 5C, the plurality of jig magnets 580 is fixed to the third support unit 503 and the fourth support unit 504. The plurality of jig magnets 580 is magnets used to attach the display device 100 and the mounting jig 500 to each other. The plurality of jig magnets 580 may be a bar type neodymium (Nd) dipole magnet including one N pole and one S pole, but is not limited thereto. The plurality of jig magnets 580 may be fixed to the third support unit 503 and the fourth support unit 504 by an adhesive layer or fixed thereto by a separate fixing mechanism. Further, the plurality of jig magnets 580 may not be directly fixed to the third support unit 503 and the fourth support unit 504, but may be indirectly fixed to the third support unit 503 and the fourth support unit 504 by being fixed to the plurality of jig ferromagnetic materials 590. Therefore, the plurality of jig magnets 580 may be disposed between one end of the plurality of jig ferromagnetic materials 590 which is opposite to the rear surface of the metal plate 120 and the other end of the plurality of jig ferromagnetic materials 590.

Referring to FIGS. 5A to 5C, the plurality of jig magnets 580 includes a first jig magnet 581, a second jig magnet 582, a third jig magnet 583, and a fourth jig magnet 584. In this case, the first jig magnet 581 and the third jig magnet 583 may be disposed in the third support unit 503 and the second jig magnet 582 and the fourth jig magnet 584 may be disposed in the fourth support unit 504. In this case, the first jig magnet 581 and the second jig magnet 582 may be disposed in parallel in the X axis direction and the third jig magnet 583 and the fourth jig magnet 584 may be disposed in parallel in the X axis direction. Further, the first jig magnet 581 and the third jig magnet 583 may be disposed in parallel in the Y axis direction and the second jig magnet 582 and the fourth jig magnet 584 may be disposed in parallel in the Y axis direction. However, the arrangement position of the jig magnet 580 and the number of jig magnets 580 are not limited thereto and may be designed so as to correspond to the arrangement position and the number of panel magnets 130 disposed in the display device 100.

In this case, the polarity of the jig magnet 580 may be set to correspond to the polarity of the panel magnet 130. That is, as it will be described below, the jig magnet 580 needs to attach the mounting jig 500 and the display device 100 using a magnetic force with the panel magnet 130 so that the jig magnets 580 and the panel magnets 130 which overlap each other may be designed to have opposite polarities. For example, the N pole and the S pole of the first jig magnet 581 may be disposed such that the N pole of the first jig magnet 581 corresponds to the S pole 131S of the first panel magnet 131 and the S pole of the first jig magnet 581 corresponds to the N pole of the first panel magnet 131.

Referring to FIGS. 5A to 5C, each of the plurality of jig ferromagnetic materials 590 is disposed in the third support unit 503 and the fourth support unit 504 and disposed at both side surfaces of each of the plurality of jig magnets 580. The plurality of jig ferromagnetic materials 590 includes a first jig ferromagnetic material 591, a second jig ferromagnetic material 592, a third jig ferromagnetic material 593, and a fourth jig ferromagnetic material 594. Further, the first jig ferromagnetic material 591 and the third jig ferromagnetic material 593 may be fixed to the third support unit 503 and the second jig ferromagnetic material 592 and the fourth jig ferromagnetic material 594 may be fixed to the fourth support unit 504. The plurality of jig ferromagnetic materials 590 may be formed of various ferromagnetic materials, and for example, may be formed of steel, but the material is not specifically limited.

Referring to FIGS. 5A to 5C, the handle 505 which allows the operator to grasp the mounting jig 500 to perform the job is fixed to the third support unit 503 and the fourth support unit 504. The operator may align and attach the mounting jig 500 to the display device 100 using the handle 505 fixed to the third support unit 503 and the fourth support unit 504 and freely align the display device 100 during the process of tiling the display device 100. A shape of the handle 505 is not limited to the shape illustrated in FIGS. 5A to 5C, but may be freely determined.

Referring to FIGS. 5A to 5C, the hinge structure 506 is fixed to the first support unit 501, the second support unit 502, the third support unit 503, and the fourth support unit 504. The hinge structure 506 is a structure which allows the operator who grasps the handle 505 to rotate the handle 505 in a direction marked by an arrow illustrated in FIG. 5C. Specifically, the operator may inwardly rotate the left handle 505 through the hinge structure 506 fixed to the first support unit 501 and the third support unit 503, and the second support unit 502 and the third support unit 503, respectively. Further, the operator may inwardly rotate the right handle 505 through the hinge structure 506 fixed to the first support unit 501 and the fourth support unit 504, and the second support unit 502 and the fourth support unit 504, respectively. The operator may more easily attach and detach the jig magnet 580 of the mounting jig 500 and the panel magnet 130 of the display device 100, through the hinge structure 506 as described above. However, the shape and the structure of the mounting jig 500 used in the method of manufacturing a tiling display device according to one exemplary aspect of the present disclosure are not limited to FIGS. 5A to 5C. When the jig magnet 580 disposed so as to correspond to the panel magnet 130 of the display device 100 and the jig ferromagnetic materials 590 disposed on both sides of the jig magnet 580 are used, the mounting jig 500 may be designed to have various shapes and structures.

In the meantime, even though in FIGS. 5A to 5C, it is illustrated that the mounting jig 500 includes a plurality of jig ferromagnetic materials 590, the plurality of jig ferromagnetic materials 590 may be omitted. As described above, when the plurality of jig ferromagnetic materials 590 is omitted, a size of each of the plurality of jig magnets 580 may be designed to correspond to a sum of a size of each of the plurality of panel magnets 130 and a size of each of the plurality of panel ferromagnetic materials.

Hereinafter, a method of manufacturing the tiling display device TD using a mounting jig 500 will be described in more detail with reference to FIGS. 6A to 6C.

FIGS. 6A to 6F are cross-sectional views for explaining a method of manufacturing a tiling display device according to an exemplary aspect of the present disclosure. In FIGS. 6A to 6F, for the convenience of description, among various configurations of the mounting jig 500, only the first jig magnet 581, the first jig ferromagnetic material 591, the second jig magnet 582, and the second jig ferromagnetic material 592 corresponding to the first panel magnet 131, the first panel ferromagnetic material 141, the second panel magnet 132, and the second panel ferromagnetic material 142 of the display device 100 are illustrated. However, the same principle may be applied to the third jig magnet 583, the third jig ferromagnetic material 593, the fourth jig magnet 584, and the fourth jig ferromagnetic material 594 corresponding to the third panel magnet 133, the third panel ferromagnetic material 143, the fourth panel magnet 134, and the fourth panel ferromagnetic material 144 of the display device 100.

Figure 6A:
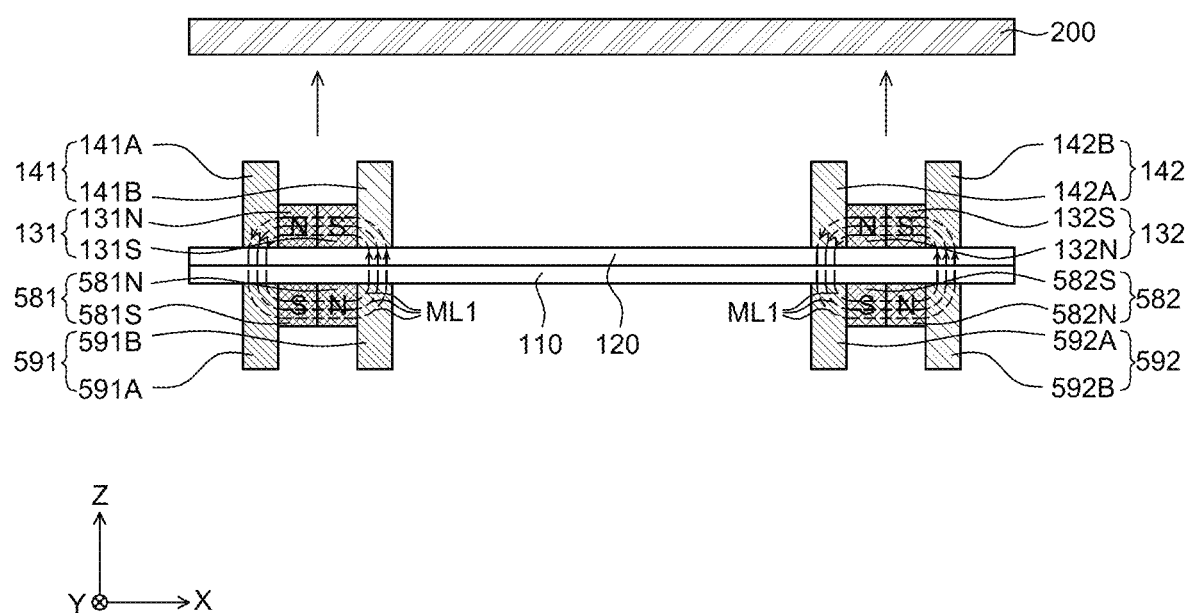
FIGS. 6A to 6F are cross-sectional views for explaining a method of manufacturing a tiling display device according to an exemplary aspect of the present disclosure.

First, referring to FIG. 6A, the mounting jig 500 is attached to a front surface of the display device 100. In this case, the first jig magnet 581, the first jig ferromagnetic material 591, the second jig magnet 582, and the second jig ferromagnetic material 592 of the mounting jig 500 are disposed respectively so as to correspond to the first panel magnet 131, the first panel ferromagnetic material 141, the second panel magnet 132, and the second panel ferromagnetic material 142 of the display device 100 to attach the mounting jig 500 to the front surface of the display device 100.

The mounting jig 500 may be attached to the display device 100 such that the plurality of panel magnets 130 corresponds to the plurality of jig magnets 580 and the plurality of panel ferromagnetic materials 140 corresponds to the plurality of jig ferromagnetic materials 590. For example, as illustrated in FIG. 6A, polarities of the first jig magnet 581 and the second jig magnet 582 of the mounting jig 500 overlap opposite polarities of the corresponding first panel magnet 131 and second panel magnet 132 of the display device 100. That is, the mounting jig 500 may be disposed as follows: the N pole 581N of the first jig magnet 581 overlaps the S pole 131S of the first panel magnet 131 and the S pole 581S of the first jig magnet 581 overlaps the N pole 131N of the first panel magnet 131. Further, the N pole 582N of the second jig magnet 582 overlaps the S pole 132S of the second panel magnet 132 and the S pole 582S of the second jig magnet 582 overlaps the N pole 132N of the second panel magnet 132. Further, the mounting jig 500 may be disposed as follows: the first portion 591A of the first jig ferromagnetic material 591 overlaps the first portion 141A of the first panel ferromagnetic material 141 and the second portion 591B of the first jig ferromagnetic material 591 overlaps the second portion 141B of the first panel ferromagnetic material 141. Further, the first portion 592A of the second jig ferromagnetic material 592 overlaps the first portion 142A of the second panel ferromagnetic material 142 and the second portion 592B of the second jig ferromagnetic material 592 overlaps the second portion 142B of the second panel ferromagnetic material 142. As described above, the mounting jig 500 is disposed so that a first magnetic line ML1 is induced to the first jig magnet 581, the first jig ferromagnetic material 591, the first panel magnet 131, and the first panel ferromagnetic material 141. Further, the first magnetic line ML1 is also induced to the second jig magnet 582, the second jig ferromagnetic material 592, the second panel magnet 132, and the second panel ferromagnetic material 142.

The operator grasps the handle 505 of the mounting jig 500 to carry the display device 100 attached to the mounting jig 500 in the Z axis direction represented by an arrow in FIG. 6A, that is, toward the wall portion 200, by the first magnetic line ML1.

Figure 6B:
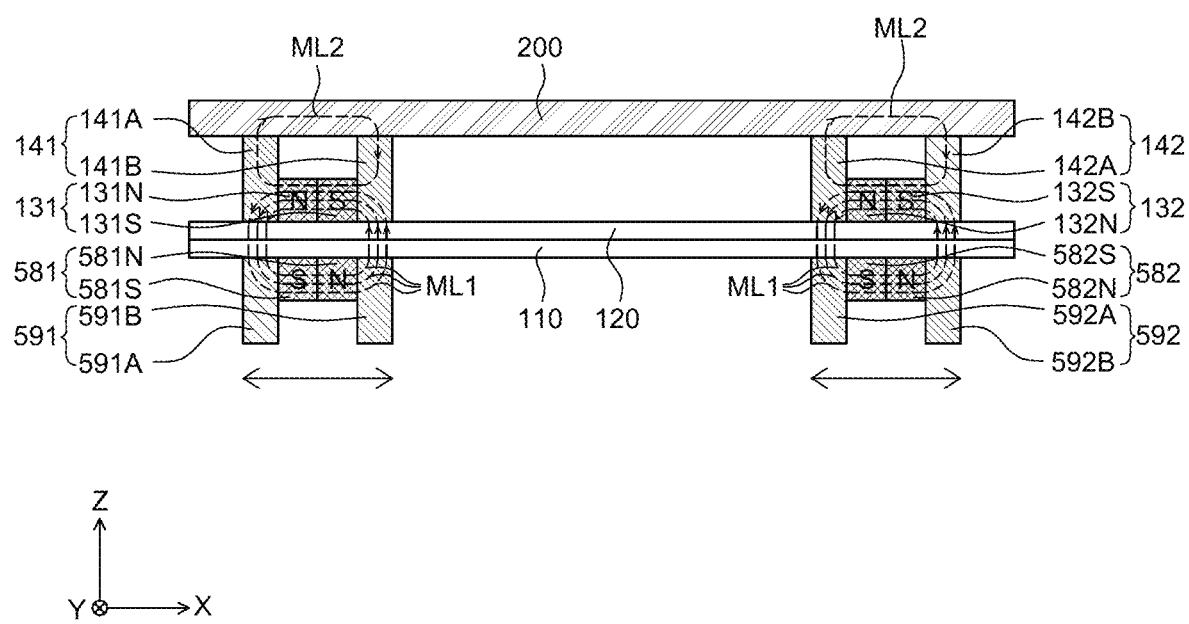

Referring to FIG. 6B, the display device 100 is brought into contact with the wall portion 200. The first panel ferromagnetic material 141 and the second panel ferromagnetic material 142 disposed on the rear surface of the display device 100 may be in contact with the wall portion 200. In this case, the wall portion 200 may have a plate shape formed of a metal material, and, for example, may be a plate formed of steel which is a ferromagnetic material, but is not limited thereto. Therefore, the wall portion 200 does not need to have a complex shape or include a complex mechanism, but may be a simple plate shape formed of a metal material to which the first panel ferromagnetic material 141 and the second panel ferromagnetic material 142 are attached by the magnetism. Therefore, when the display device 100 is brought into contact with the wall portion 200, there is no need to precisely align the first panel ferromagnetic material 141 and the second panel ferromagnetic material 142 in a specific position of the wall portion 200, so that the relatively less precise alignment is acceptable.

In a state in which the display device 100 is in contact with the wall portion 200, a second magnetic line ML2 is induced to the wall portion 200, the first panel ferromagnetic material 141, and the first panel magnet 131 and the second magnetic line ML2 is also induced to the wall portion 200, the second panel ferromagnetic material 142, and the second panel magnet 132. However, the first magnetic line ML1 is induced by two magnets and four ferromagnetic materials and the second magnetic line ML2 is induced by one magnet and two ferromagnetic materials. Therefore, the intensity of the first magnetic line ML1 may be stronger than the intensity of the second magnetic line ML2. Therefore, a force of the mounting jig 500 which fixes the display device 100 by the first magnetic line ML1 is stronger than a force of fixing the display device 100 and the wall portion 200 so that the display device 100 is not fixed to the wall portion 200 and the operator may move the display device 100 by moving the mounting jig 500. Specifically, in a state that the display device 100 is in contact with the wall portion 200, the operator moves the mounting jig 500 to move the display device 100 in the X axis direction as represented by the arrow of FIG. 6B and move the display device 100 also in the Y axis direction. Therefore, the operator may more precisely align the display device 100 in a state that the display device 100 is in contact with the wall portion 200 to finally align the display device 100.

As illustrated in FIG. 6B, when there is a second magnetic line ML2, the operator may more easily align the display device 100. That is, when there is a second magnetic line ML2 between the display device 100 and the wall portion 200, an attractive force is generated between the display device 100 and the wall portion 200 by the second magnetic line ML2. Therefore, as compared with an example that the second magnetic line ML2 is not generated, when the operator moves the display device 100 with the same force, a distance by which the display device 100 moves may be small. Therefore, the operator may more minutely move the display device 100 by the second magnetic line ML2, so that the operator may more easily align the display device 100.

However, in order to completely remove the second magnetic line ML2 to improve a slippage degree during the alignment process of the display device 100, intensities of the jig magnet 580 of the mounting jig 500 and the panel magnet 130 of the display device 100 are adjusted to completely remove the second magnetic line ML2. That is, the magnetic force of the jig magnet 580 of the mounting jig 500 is set to be much stronger than the magnetic force of the panel magnet 130 of the display device 100 to remove the second magnetic line ML2 and remain only the first magnetic line ML1.

Figure 6C:
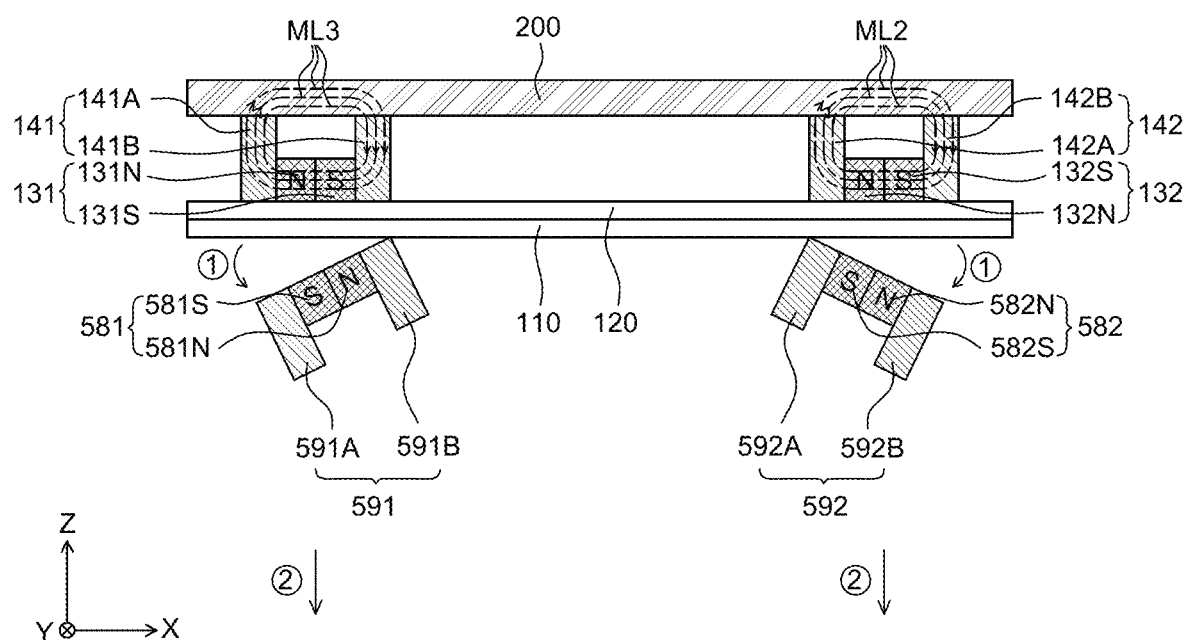

Referring to FIG. 6C, the mounting jig 500 may be detachable from the display device 100. That is, after aligning the display device 100 in a desired position, the mounting jig 500 may be detached from the display device 100 using the handle 505 of the mounting jig 500.

Specifically, as described in detail with reference to FIGS. 5A to 5C, the operator may rotate the handle 505 of the mounting jig 500 using the hinge structure 506. In this case, as illustrated in FIG. 6C, the first jig magnet 581, the first jig ferromagnetic material 591, the second jig magnet 582, and the second jig ferromagnetic material 592 of the mounting jig 500 rotate in a direction represented by an arrow ① to be detached from the display device 100. Even though in FIG. 6C, for the convenience of illustration, it is illustrated the arrow ① is located on an X-Z plane, actually, the arrow ① is located on an Y-Z plane.

As the first jig magnet 581, the first jig ferromagnetic material 591, the second jig magnet 582, and the second jig ferromagnetic material 592 of the mounting jig 500 are detached from the display device 100, the first magnetic line ML1 is removed. Further, a third magnetic line ML3 having a stronger intensity than that of the second magnetic line ML2 may be induced to the wall portion 200, the first panel ferromagnetic material 141, and the first panel magnet 131, and the wall portion 200, the second panel ferromagnetic material 142, and the second panel magnet 132. Therefore, after completely separating the mounting jig 500 from the display device 100 in an arrow ②, the display device 100 may be attached and fixed to the wall portion 200 by the third magnetic line ML3.

In the meantime, in the state in which the tiling display device TD is manufactured using the processes illustrated in FIGS. 6A to 6C, there may be a situation that the display device 100 needs to be separated from the wall portion 200 to replace or repair a specific display device 100 or disassemble the tiling display device TD. Also, in this case, the display device 100 may be easily detached from the wall portion 200 using the mounting jig 500.

Figure 6D:
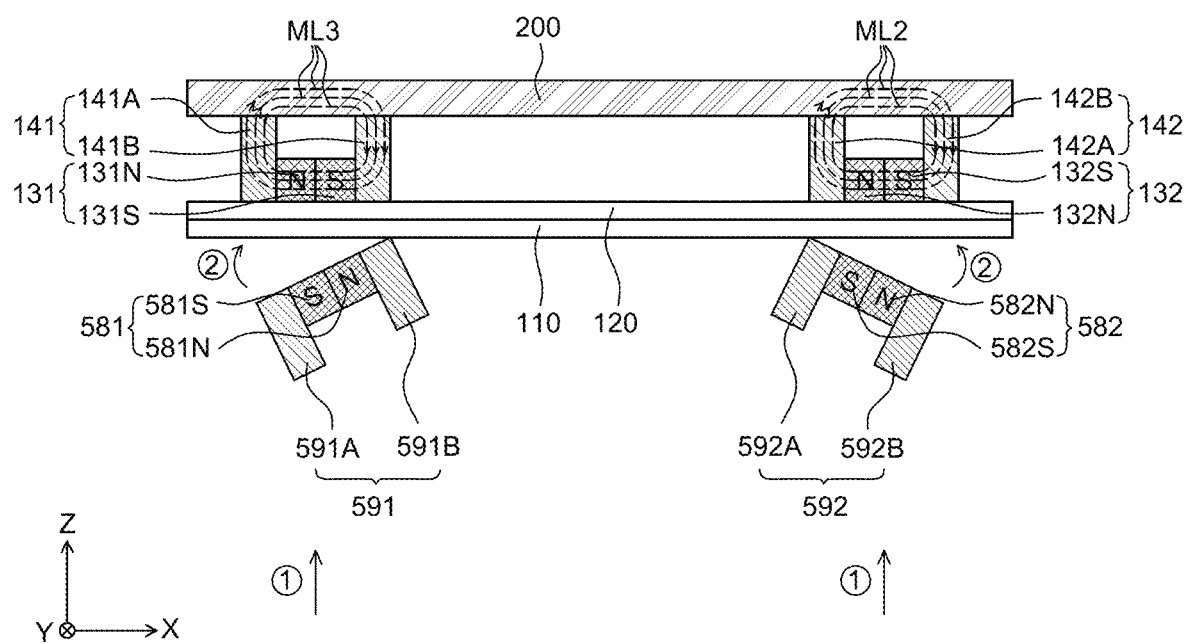

First, referring to FIG. 6D, the operator may move the mounting jig 500 in a direction represented by the arrow ① to be in contact with the display device 100. In this case, the operator may align the mounting jig 500 in a desired position of the display device 100. The mounting jig 500 may be aligned on the front surface of the display device 100 such that the plurality of panel magnets 130 corresponds to the plurality of jig magnets 580 and the plurality of panel ferromagnetic materials 140 corresponds to the plurality of jig ferromagnetic materials 590.

Next, after aligning the mounting jig 500 in a desired position, the plurality of jig magnets 580 and the plurality of jig ferromagnetic materials 590 of the mounting jig 500 may be brought into contact with the display device 100 using the handle 505 of the mounting jig 500. That is, the operator rotates the handle 505 in a direction represented by an arrow ② to bring the plurality of jig magnets 580 and the plurality of jig ferromagnetic materials 590 of the mounting jig 500 into contact with the display device 100. Further, as illustrated in FIG. 6D, before bring the plurality of jig magnets 580 and the plurality of jig ferromagnetic materials 590 of the mounting jig 500 into contact with the display device 100, the third magnetic line ML3 may be induced to the wall portion 200, the first panel ferromagnetic material 141, and the first panel magnet 131 and the wall portion 200, the second panel ferromagnetic material 142, and the second panel magnet 132. Even though in FIG. 6D, for the convenience of illustration, it is illustrated the arrow ② is located on an X-Z plane, actually, the arrow ② is located on an Y-Z plane.

Figure 6E:
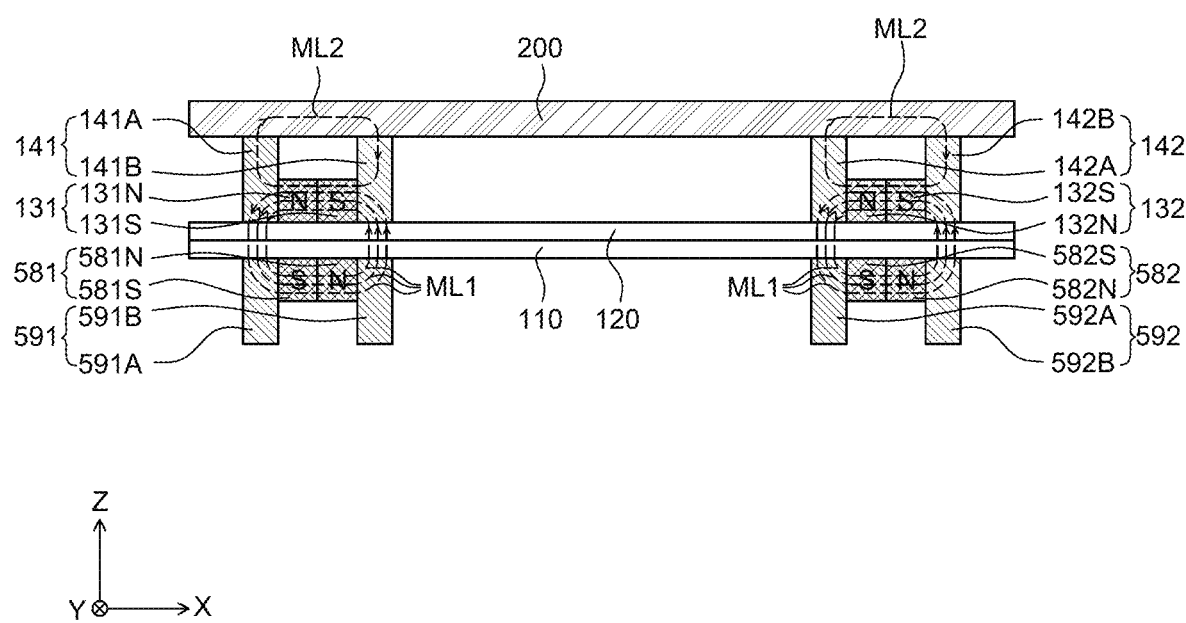

Next, referring to FIG. 6E, the mounting jig 500 may be attached to the display device 100 such that the plurality of panel magnets 130 corresponds to the plurality of jig magnets 580 and the plurality of panel ferromagnetic materials 140 corresponds to the plurality of jig ferromagnetic materials 590. For example, polarities of the first jig magnet 581 and the second jig magnet 582 of the mounting jig 500 overlap opposite polarities of the corresponding first panel magnet 131 and second panel magnet 132 of the display device 100. That is, the mounting jig 500 may be disposed as follows: the N pole 581N of the first jig magnet 581 overlaps the S pole 131S of the first panel magnet 131 and the S pole 581S of the first jig magnet 581 overlaps the N pole 131N of the first panel magnet 131. Further, the N pole 582N of the second jig magnet 582 overlaps the S pole 132S of the second panel magnet 132 and the S pole 582S of the second jig magnet 582 overlaps the N pole 132N of the second panel magnet 132. Further, the mounting jig 500 may be disposed as follows: the first portion 591A of the first jig ferromagnetic material 591 overlaps the first portion 141A of the first panel ferromagnetic material 141 and the second portion 591B of the first jig ferromagnetic material 591 overlaps the second portion 141B of the first panel ferromagnetic material 141. Further, the first portion 592A of the second jig ferromagnetic material 592 overlaps the first portion 142A of the second panel ferromagnetic material 142 and the second portion 592B of the second jig ferromagnetic material 592 overlaps the second portion 142B of the second panel ferromagnetic material 142. As described above, as the mounting jig 500 is disposed, a first magnetic line ML1 is induced to the first jig magnet 581, the first jig ferromagnetic material 591, the first panel magnet 131, and the first panel ferromagnetic material 141. Further, the first magnetic line ML1 is also induced to the second jig magnet 582, the second jig ferromagnetic material 592, the second panel magnet 132, and the second panel ferromagnetic material 142.

In this case, as the first magnetic line ML1 is induced, the second magnetic line ML2 which is weaker than the first magnetic line ML1 and the third magnetic line ML3 may be induced to the wall portion 200, the first panel ferromagnetic material 141, and the first panel magnet 131 and the wall portion 200, the second panel ferromagnetic material 142, and the second panel magnet 132. Therefore, the magnetic force between the display device 100 and the mounting jig 500 may be stronger than the magnetic force between the display device 100 and the wall portion 200.

Figure 6F:
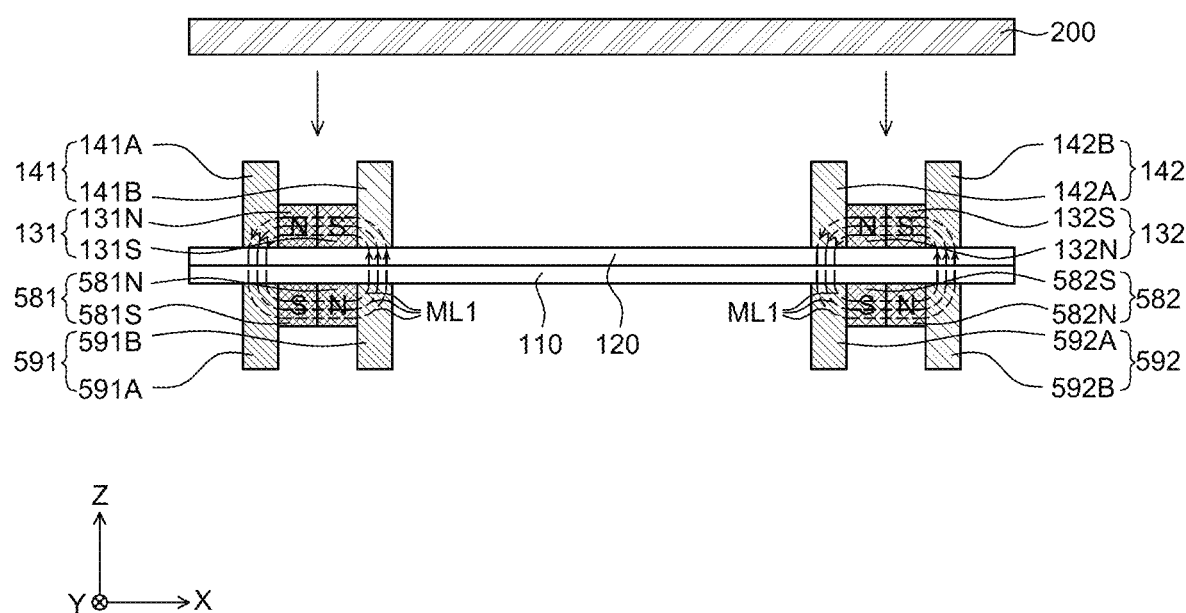

Therefore, when the operator pulls the mounting jig 500 in an arrow direction illustrated in FIG. 6F, the display device 100 attached to the mounting jig 500 may be separated from the wall portion 200. That is, a magnetic force by which the mounting jig 500 pulls the display device 100 is stronger than a magnetic force by which the wall portion 200 pulls the display device 100. Therefore, when the operator pulls the mounting jig 500, the display device 100 is separated from the wall portion 200 along the mounting jig 500. Further, the same operation is repeatedly performed on the plurality of display devices 100 to disassemble the tiling display device TD.

In the general method of manufacturing a tiling display device, a fixing mechanism is disposed on rear surfaces of the plurality of display devices and the corresponding mechanism is fastened to the wall portion. However, during the process of using the mechanism disposed on the rear surface of the display device, an operator is located behind the wall portion to perform the fastening process. Therefore, there is a problem in that a space for the operator to work needs to be ensured behind the wall portion. Further, when a specific display device among the plurality of display devices needs to be repaired, the operator needs to move to the wall portion to separate the mechanism and the wall portion one by one. Further, it is inconvenience because in order to separate one display device, not only the corresponding display device, but also the display device adjacent to the corresponding display device needs to be unfastened.

Therefore, in the display device 100, the tiling display device TD, and the method of manufacturing a tiling display device according to one exemplary aspect of the present disclosure, the plurality of panel magnets 130 and the plurality of panel ferromagnetic materials 140 disposed on the rear surface of the display panel 110 and the metal plate 120 and the mounting jig 500 including the plurality of jig magnets 580 and the plurality of jig ferromagnetic materials 590 corresponding to the plurality of panel magnets 130 and the plurality of panel ferromagnetic materials 140 are used so that the tiling display device TD may be easily manufactured on the front surface of the display device 100. That is, the display device 100 is fixed to the wall portion while grasping the display device 100 using the mounting jig 500 on the front surface of the display device 100 so that in the display device 100, the tiling display device TD, and the method of manufacturing a tiling display device according to one exemplary aspect of the present disclosure, there is no need to separately ensure a working space behind the wall portion 200. Further, the display device 100 can be easily detached from the wall portion 200 using the mounting jig 500 on the front surface of the display device 100 so that the plurality of display devices 100 may be easily installed, maintained, and repaired.

Further, in the display device 100, the tiling display device TD, and the method of manufacturing a tiling display device according to one exemplary aspect of the present disclosure, during the process of bringing the display device 100 into contact with the wall portion 200 using the mounting jig 500, there is no need to relatively precisely align the display device. When a separate mechanism is used to tile the display devices, the display device may be attached to the wall portion by precisely aligning the mechanism disposed in the display device and the wall portion or a mechanism disposed in the wall portion. However, in the display device 100, the tiling display device TD, and the method of manufacturing a tiling display device according to one exemplary aspect of the present disclosure, when the wall portion 200 is simply configured by a plate shape formed of a metal material and the plurality of panel magnets 130 and the plurality of panel ferromagnetic materials 140 of the display device 100 are in contact with the wall portion 200, the display device 100 and the wall portion 200 are primarily attached. Therefore, even though the wall portion 200 having a simple shape and structure is used, there is no need a precise alignment during the process of bringing the display device 100 into contact with the wall portion 200 for the first time, so that the operator may more easily manufacture the tiling display device TD.

In the meantime, the magnetic field has a closed curve connecting the N pole and the S pole of the magnet. In this case, separate ferromagnetic materials are in contact with each of the N pole and the S pole of the magnet, the magnetic line may extend along the ferromagnetic materials. The extension of the magnetic line may be described in the same sense as that the ferromagnetic material in contact with each of the N pole and the S pole of the magnet is temporarily magnetized.

According to this principle, in the display device 100, the tiling display device TD, and the method of manufacturing a tiling display device according to one exemplary aspect of the present disclosure, the display device 100 may be attached to the wall portion 200 using the plurality of panel magnets 130 and the plurality of panel ferromagnetic materials 140 disposed on the rear surface of the display panel 110. That is, the magnetic line of the plurality of panel magnets 130 may be extended using the plurality of panel ferromagnetic materials 140 so that the display device 100 may be fixed to the wall portion 200.

In the meantime, when the mounting jig 500 including a plurality of jig magnets 580 is brought into contact with the display device 100 in a state in which the display device 100 is fixed to the wall portion 200 as described above, a magnetic line which is stronger than the magnetic line induced between the display device 100 and the wall portion 200 may be induced between the mounting jig 500 and the display device 100. That is, the wall portion 200 may be formed of a metal material, rather than a magnet but the jig magnet 580 is disposed in the mounting jig 500. Therefore, when the mounting jig 500 is brought into contact with the display device 100, the intensity of the first magnetic line ML1 induced between the mounting jig 500 and the display device 100 may be stronger than the intensity of the second magnetic line ML2 induced between the display device 100 and the wall portion 200. This is because the wall portion 200 is not formed of a magnet which originally has a magnetic force, but formed of a material to which the magnetic line is induced so that the magnetic line is changed toward the plurality of jig magnets 580 of the mounting jig 500 which has a stronger magnetic force than the wall portion 200. This may be understood as a magnetic property corresponding to an electrical property that the current flows to a wiring line having a lower resistance among the plurality of wiring lines. Therefore, in the display device 100, the tiling display device TD, and the method of manufacturing a tiling display device according to one exemplary aspect of the present disclosure, the operator may more easily align the display devices 100 using the mounting jig 500 and easily disassemble the display device 100 from the wall portion 200.

However, when the display device 100 includes only the plurality of panel magnets 130, but does not include the plurality of panel ferromagnetic materials 140 which is in contact with the plurality of panel magnets 130 and the wall portion 200, the magnetic field between the plurality of panel magnets 130 and the wall portion 200 may not be changed. Specifically, differently from the ferromagnetic material, the magnet always has a magnetic property. Therefore, when there is no separate ferromagnetic material 140 between the plurality of panel magnets 130 and the wall portion 200, if the mounting jig 500 is brought into contact with the display device 100, the magnetic force between the display device 100 and the wall portion 200 may be amplified. That is, a magnetic force of the panel magnet 130 of the display device 100 is added to a magnetic force of the magnet of the mounting jig 500 so that the display device 100 may be more firmly fixed to the wall portion 200. However, it may be very difficult to align or disassemble the display device 100 using the mounting jig 500. In contrast, in the display device 100, the tiling display device TD, and the method of manufacturing a tiling display device according to one exemplary aspect of the present disclosure, when the mounting jig 500 is brought into contact with the display device 100 using the plurality of panel ferromagnetic materials 140 which is in contact with the plurality of panel magnets 130 for the display device 100, the second magnetic force line ML2 which is weaker than the third magnetic line ML3 induced to the plurality of panel magnets 130 and the wall portion 200 is induced to the plurality of panel magnets 130 and the wall portion 200. Further, the first magnetic force line ML1 which is stronger than the second magnetic line ML2 may be induced to the plurality of jig magnets 580 and the plurality of panel magnets 130. Therefore, in the display device 100, the tiling display device TD, and the method of manufacturing a tiling display device according to one exemplary aspect of the present disclosure, the operator may more easily align the display devices 100 using the mounting jig 500 and easily disassemble the display device 100 from the wall portion 200.

Further, in the display device 100, the tiling display device TD, and the method of manufacturing a tiling display device according to one exemplary aspect of the present disclosure, when some of display devices which configure the tiling display device TD is deviated, the interval and arrangement of the plurality of display devices 100 may be easily realigned without disassembling and reassembling all the plurality of display devices 100. That is, the mounting jig 500 is attached to a display device 100 which needs to be realigned on the front surface of the tiling display device TD to realign the display devices 100. Therefore, the display devices 100 may be easily realigned without disassembling or reassembling the plurality of display devices 100.

Further, in the display device 100, the tiling display device TD, and the method of manufacturing a tiling display device according to one exemplary aspect of the present disclosure, the damages of the adjacent display devices 100 caused by the impact during the process of aligning the plurality of display devices 100 may be minimized. Referring to FIG. 3, the panel magnets 130 disposed in parallel in the X axis direction may be disposed such that the same polarities are parallel. Therefore, each of the N pole 132N and the S pole 132S of the second panel magnet 132 of one display device 100 may be disposed to be parallel to the N pole 131N and the S pole 131S of the first panel magnet 131 of another display device 100 disposed to be adjacent to the corresponding display device 100. Further, each of the N pole 134N and the S pole 134S of the fourth panel magnet 134 of one display device 100 may be disposed to be parallel to the N pole 133N and the S pole 133S of the third panel magnet 133 of another display device 100 disposed to be adjacent to the corresponding display device 100. Therefore, when the display device 100 approaches another display device 100 which is adjacent to the corresponding display device 100 during the process of aligning one display device 100, the plurality of panel magnets 130 disposed in one display device 100 and the plurality of panel magnets 130 disposed in another display device 100 which are disposed in parallel may be disposed such that the same polarities are parallel to each other. Therefore, a repulsive force may be generated between the plurality of panel magnets 130 disposed in one display device 100 and the plurality of panel magnets 130 disposed in another display device 100. Therefore, the damage of another adjacent display device 100 caused by the display device 100 which rapidly moves during the process of aligning one display device 100 may be reduced.

Figure 7:
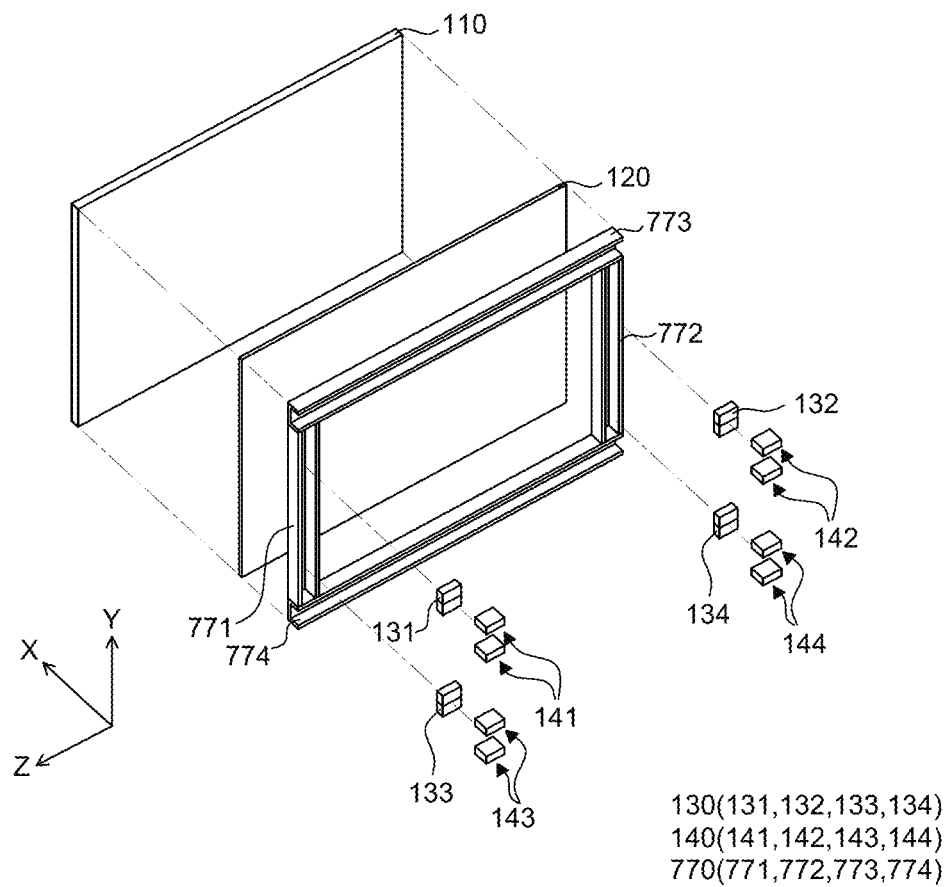
FIG. 7 is an exploded perspective view of a display device according to another aspect of the present disclosure.
Figure 8:
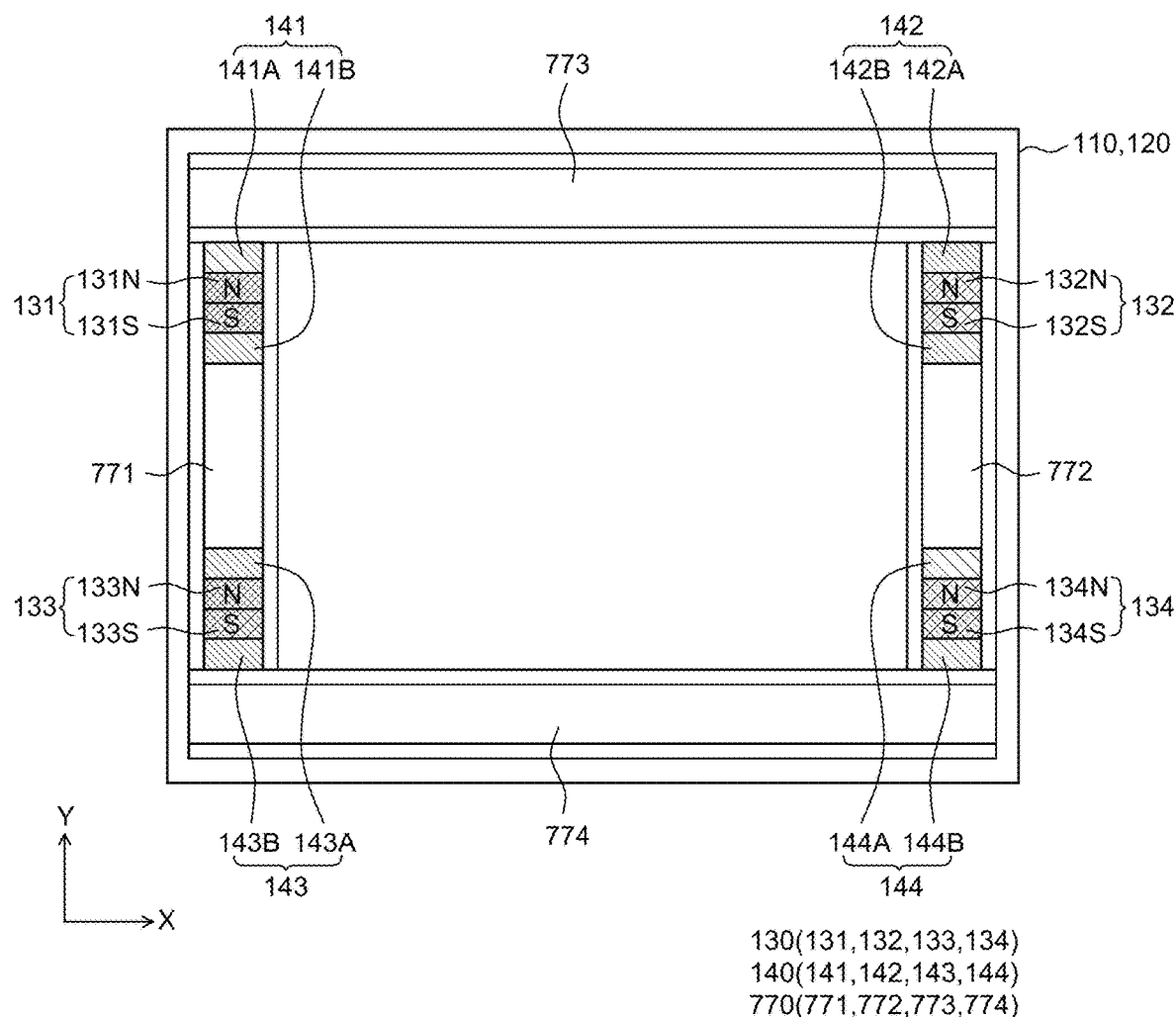
FIG. 8 is a rear view of a display device according to another exemplary aspect of the present disclosure.

FIG. 7 is an exploded perspective view of a display device according to another aspect of the present disclosure. FIG. 8 is a rear view of a display device according to another exemplary aspect of the present disclosure. As compared with the display device 100 described with reference to FIGS. 1 to 6F, a display device 700 of FIGS. 7 and 8 further includes a frame 770, but other components are substantially the same. Therefore, a redundant description will be omitted.

Referring to FIGS. 7 and 8, a plurality of frames 770 is disposed on a rear surface of the metal plate 120. When the display panel 110 is warped due to heat which is applied to the display panel during the process of manufacturing the display panel 110, the plurality of frames 770 minimizes the warpage of the display panel 110. The plurality of frames 770 may be disposed on the rear surface of the metal plate 120 to be adjacent to the edges of the display panel 110 and the metal plate 120. Therefore, the plurality of frames 770 may be disposed between the plurality of panel magnets 130 and the metal plate 120. The plurality of frames 770 may be formed of a material having a rigidity and for example, may be formed of a metal or plastic material, but is not limited thereto.

The plurality of frames 770 includes a first frame 771, a second frame 772, a third frame 773, and a fourth frame 774. Specifically, the first frame 771 is disposed to be adjacent to a left edge of the metal plate 120, the second frame 772 is disposed to be adjacent to a right edge of the metal plate 120, the third frame 773 is disposed to be adjacent to an upper edge of the metal plate 120, and the fourth frame 774 is disposed to be adjacent to a lower edge of the metal plate 120. Even though in FIGS. 7 and 8, it is illustrated that four frames 770 are disposed to be adjacent to all four edges of the metal plate 120, the frame may be disposed only at some of four edges of the metal plate in consideration of a warping degree and a warped position of the display panel 110. Therefore, one or more frames 770 may be used.

In the display device 700 according to another exemplary aspect of the present disclosure, during the process of manufacturing a display panel 110 of the display device 700, when the warpage of the display panel 110 is generated after the process of manufacturing the display panel 110 or after being manufactured as a tiling display device TD, the frame 770 may be used to minimize the warpage generated in the display panel 110. During the process of manufacturing a display panel 110, various insulating layers and metal layers are formed and the insulating layers and metal layers may be manufactured by a high temperature process. In this case, a substrate which serves to support the display panel 110 may be warped. Further, when the display panel 110 is implemented to include a display element such as an LED or a micro LED, the display panel 110 may be manufactured as follows: a display element and a wiring line, a transistor, and the like for driving the display element are disposed on a top surface of one substrate and a gate driver and a data driver are directly disposed on a rear surface of the other substrate or a flexible film such as a chip on film (COF) and a printed circuit board PCB are disposed on the rear surface. Thereafter, two substrates are bonded. In this case, during the process of bonding two substrates, the display panel 110 may be warped. Furthermore, during a transporting process or a process of manufacturing a tiling display device TD using the display panel 110 after manufacturing the display panel 110, the display panel 110 may be warped due to a mechanical force, external force, temperature change, or the like. Therefore, in the display device 700 according to another exemplary aspect of the present disclosure, the plurality of frames 770 is disposed on the rear surface of the metal plate 120 to minimize the warpage to be generated in the display panel 110.

In the meantime, as described above, when the display panel 110 is implemented to include a display element such as an LED or a micro LED, the display panel 110 may be implemented using two substrates. In this case, the plurality of panel magnets 130 and the plurality of panel ferromagnetic materials 140 may be disposed so as not to overlap the flexible film and the printed circuit board disposed on the other one substrate between two substrates. As described above with reference to FIGS. 6A to 6F, during the process of fixing the display device 700 to the wall portion 200, the plurality of jig magnets 580 and the plurality of jig ferromagnetic materials 590 of the mounting jig 500 may overlap the plurality of panel magnets 130 and the plurality of panel ferromagnetic materials 140. Therefore, at the moment that the mounting jig 500 is attached to the display device 700, at the moment that the display device 700 is attached to the wall portion 200, and at the moment that the display device 700 is aligned on the wall portion 200 using the mounting jig 500, force may be applied to an area where the plurality of panel magnets 130 and the plurality of panel ferromagnetic materials 140 are disposed. In this case, when the plurality of panel magnets 130 and the plurality of panel ferromagnetic materials 140 and the flexible film and the printed circuit board are disposed to overlap, the flexible film and the printed circuit board may be damaged due to the force applied by the operator. Therefore, in the display device 700, the tiling display device TD, and the method of manufacturing a tiling display device according to another exemplary aspect of the present disclosure, the flexible film and the printed circuit board which may be included in the display device 700 are disposed so as not to overlap the plurality of panel magnets 130 and the plurality of panel ferromagnetic materials 140. Therefore, the damage caused on the flexible film and the printed circuit board during the process of manufacturing a tiling display device TD may be avoided. Therefore, the degradation of the driving reliability of the display device 700 and the tiling display device TD may be avoided.

Figure 9:
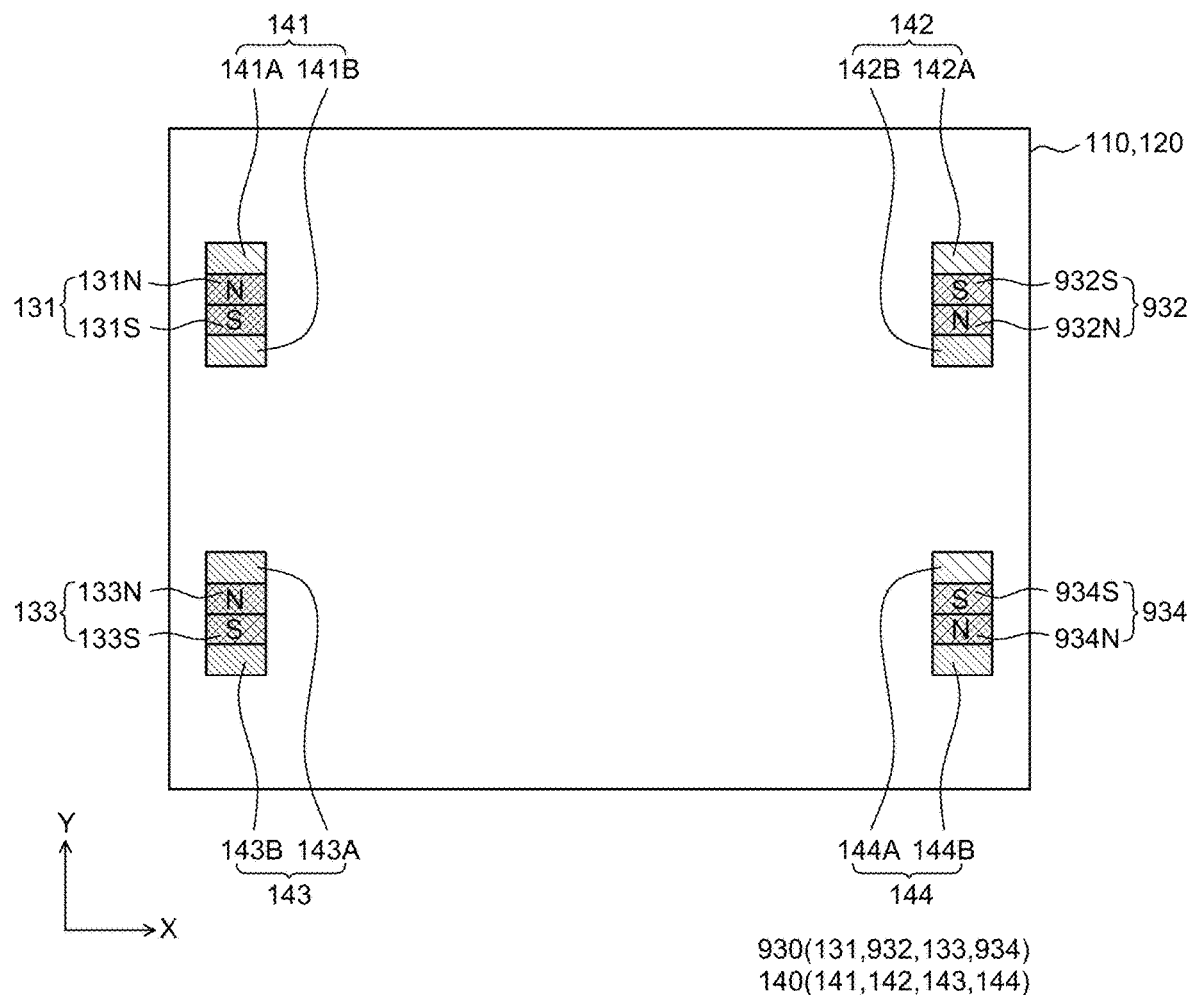
FIG. 9 is a rear view of a display device according to still another exemplary aspect of the present disclosure.

FIG. 9 is a rear view of a display device according to still another exemplary aspect of the present disclosure. The difference between the display device of FIG. 9 and the display device 100 described with reference to FIGS. 1 to 6F is that the arrangement of the plurality of panel magnets 930 is changed, but other components are substantially the same. Therefore, a redundant description will be omitted.

Referring to FIG. 9, a plurality of panel magnets 930 includes a first panel magnet 131, a second panel magnet 932, a third panel magnet 133, and a fourth panel magnet 934. Each of the plurality of panel magnets 930 may be disposed to be adjacent to edges of the display panel 110 and the metal plate 120. For example, the first panel magnet 131 and the third panel magnet 133 are disposed to be adjacent to left edges of the display panel 110 and the metal plate 120 and the second panel magnet 932 and the fourth panel magnet 934 are disposed to be adjacent to right edges of the display panel 110 and the metal plate 120. In this case, the first panel magnet 131 and the second panel magnet 932 may be disposed to be parallel in the X axis direction and the third panel magnet 133 and the fourth panel magnet 934 may also be disposed to be parallel in the X axis direction. That is, the first panel magnet 131 and the second panel magnet 932 and the third panel magnet 133 and the fourth panel magnet 934 may be disposed in parallel to be substantially parallel to the upper edge and the lower edge which are long sides of the display panel 110 and the metal plate 120. Further, the first panel magnet 131 and the third panel magnet 133 may be disposed in parallel in the Y axis direction and the second panel magnet 932 and the fourth panel magnet 934 may also be disposed in parallel in the Y axis direction. That is, the first panel magnet 131 and the third panel magnet 133 and the second panel magnet 932 and the fourth panel magnet 934 may be disposed in parallel to be substantially parallel to the left edge and the right edge which are short sides of the display panel 110 and the metal plate 120.

Referring to FIG. 9, the panel magnets 930 disposed in parallel in the X axis direction may be disposed such that different polarities are parallel. For example, an N pole 131N of the first panel magnet 131 and an S pole 932S of the second panel magnet 932 are disposed to be parallel and an S pole 131S of the first panel magnet 131 and an N pole 932N of the second panel magnet 932 are disposed to be parallel. Therefore, a virtual line connecting the N pole 131N of the first panel magnet 131 and the N pole 932N of the second panel magnet 932 may cross a virtual line connecting the S pole 131S of the first panel magnet 131 and the S pole 932S of the second panel magnet 932. Similarly, an N pole 133N of the third panel magnet 133 and an S pole 934S of the fourth panel magnet 934 are disposed to be parallel and an S pole 133S of the third panel magnet 133 and an N pole 934N of the fourth panel magnet 934 are disposed to be parallel. Therefore, a virtual line connecting the N pole 133N of the third panel magnet 133 and the N pole 934N of the fourth panel magnet 934 may cross a virtual line connecting the S pole 133S of the third panel magnet 133 and the S pole 934S of the fourth panel magnet 934.

In the display device 900, the tiling display device TD, and the method of manufacturing a tiling display device according to another exemplary aspect of the present disclosure, a space between adjacent display devices 900 may be minimized during the process of aligning the plurality of display devices 900. Referring to FIG. 9, the panel magnets 930 disposed in parallel in the X axis direction may be disposed such that different polarities are parallel. Therefore, each of the N pole 932N and the S pole 932S of the second panel magnet 932 of one display device 900 may be disposed to be parallel to the S pole 131S and the N pole 131N of the first panel magnet 131 of another display device 900 disposed to be adjacent to the corresponding to the display device 900. Further, each of the N pole 934N and the S pole 934S of the fourth panel magnet 934 of the display device 900 may be disposed to be parallel to the S pole 133S and the N pole 133N of the third panel magnet 133 of another display device 900 disposed to be adjacent to the corresponding to the display device 900. Therefore, when the display device 900 approaches another display device 900 which is adjacent to the corresponding display device 900 during the process of aligning one display device 900, the plurality of panel magnets 930 disposed in one display device 900 and the plurality of panel magnets 930 disposed in another display device 900 which are disposed in parallel may be disposed such that the different polarities are parallel to each other. Therefore, an attractive force may be generated between the plurality of panel magnets 930 disposed in one display device 900 and the plurality of panel magnets 930 disposed in another display device 900. Therefore, the interval between adjacent display devices 900 may be minimized by the attractive force between the panel magnet 930 of a display device 900 to be aligned and another display device 900 adjacent to the corresponding display device 900. Therefore, the interval between the plurality of display devices 900 is minimized to minimize the degradation of an immersion level and the visibility by the boundary area between the plurality of display devices 900 at the time of viewing the images.

Figure 10:
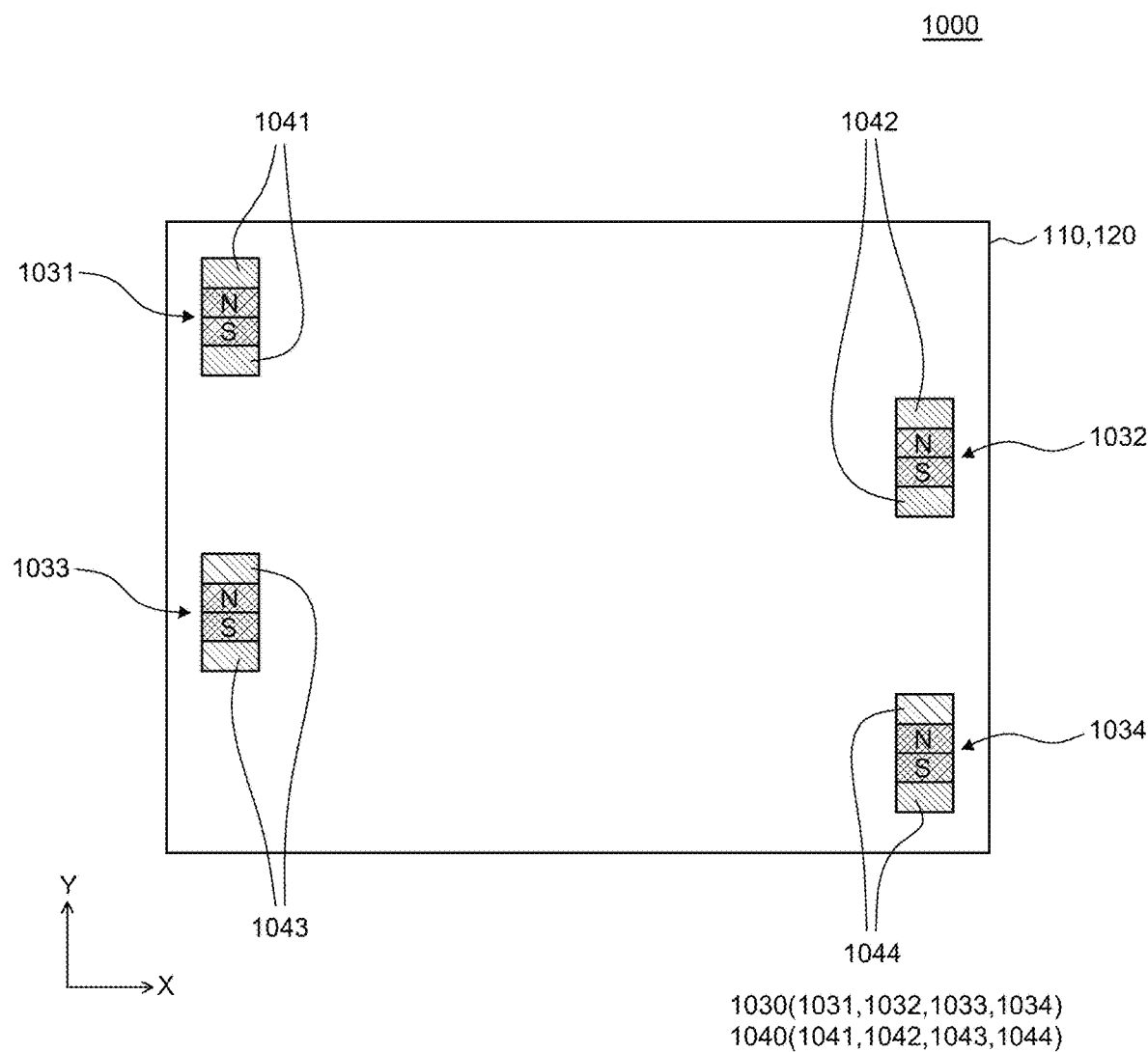
FIG. 10 is a rear view of a display device according to another exemplary aspect of the present disclosure.

FIG. 10 is a rear view of a display device according to another exemplary aspect of the present disclosure. The difference between the display device 1000 of FIG. 10 and the display device 100 described with reference to FIGS. 1 to 6F is that the arrangement of a plurality of panel magnets 1030 and a plurality of panel ferromagnetic materials 1040 is changed, but other components are substantially the same. Therefore, a redundant description will be omitted.

Referring to FIG. 10, a plurality of panel magnets 1030 includes a first panel magnet 1031, a second panel magnet 1032, a third panel magnet 1033, and a fourth panel magnet 1034. Each of the plurality of panel magnets 1030 may be disposed to be adjacent to edges of the display panel 110 and the metal plate 120. For example, the first panel magnet 1031 and the third panel magnet 1033 are disposed to be adjacent to left edges of the display panel 110 and the metal plate 120 and the second panel magnet 1032 and the fourth panel magnet 1034 are disposed to be adjacent to right edges of the display panel 110 and the metal plate 120. In this case, the first panel magnet 1031 and the second panel magnet 1032 may be disposed to be parallel in a direction different from the X axis direction and the Y axis direction and the third panel magnet 1033 and the fourth panel magnet 1034 may also be disposed to be parallel in a direction different from the X axis direction and the Y axis direction. That is, the first panel magnet 1031 and the second panel magnet 1032 and the third panel magnet 1033 and the fourth panel magnet 1034 may be disposed in a direction different from long sides and the short side of the display panel 110 and the metal plate 120. However, the first panel magnet 1031 and the third panel magnet 1033 may be disposed in parallel in the Y axis direction and the second panel magnet 1032 and the fourth panel magnet 1034 may also be disposed in parallel in the Y axis direction. That is, the first panel magnet 1031 and the third panel magnet 1033 and the second panel magnet 1032 and the fourth panel magnet 1034 may be disposed in parallel to be substantially parallel to the left edge and the right edge which are short sides of the display panel 110 and the metal plate 120.

Referring to FIG. 10, each of the plurality of panel ferromagnetic materials 1040 is disposed on the rear surface of the metal plate 120 and both side surfaces of each of the plurality of panel magnets 1030. The plurality of panel ferromagnetic materials 1040 includes a first panel ferromagnetic material 1041, a second panel ferromagnetic material 1042, a third panel ferromagnetic material 1043, and a fourth panel ferromagnetic material 1044. As described above, as the plurality of panel magnets 1030 is disposed, the first panel ferromagnetic material 1041 and the second panel ferromagnetic material 1042 may be disposed in parallel in a direction different from the X axis direction and the Y axis direction and the third panel ferromagnetic material 1043 and the fourth panel ferromagnetic material 1044 may also be disposed to be parallel in a direction different from the X axis direction and the Y axis direction. That is, the first panel ferromagnetic material 1041 and the second panel ferromagnetic material 1042 and the third panel ferromagnetic material 1043 and the fourth panel ferromagnetic material 1044 may be disposed in a direction different from long sides and the short side of the display panel 110 and the metal plate 120.

In the display device 1000, the tiling display device TD, and the method of manufacturing a tiling display device according to another exemplary aspect of the present disclosure, during the process of aligning the plurality of display devices 1000, the operator may freely manufacture the tiling display device TD without being interfered with the magnetic force between the plurality of panel magnets 1030 of adjacent display devices 100. Referring to FIG. 10, the first panel magnet 1031 and the second panel magnet 1032 may be disposed to be parallel in a direction different from the X axis direction and the Y axis direction and the third panel magnet 1033 and the fourth panel magnet 1034 may also be disposed to be parallel in a direction different from the X axis direction and the Y axis direction. Therefore, for example, when one display device 1000 is brought to be close to the other display device 1000 to align the display devices 1000, the second panel magnet 1032 of one display device 1000 may be disposed so as to correspond to a space between the first panel magnet 1031 and the third panel magnet 1033 of the other display device 1000. Therefore, the panel magnet 1030 of the other display device 1000 is not disposed in a position parallel to the second panel magnet 1032 of one display device 1000 in the X axis direction. Therefore, during the process of aligning one display device 1000, the attractive force and the repulsive force between the plurality of panel magnets 1030 of one display device 1000 and the plurality of panel magnets of the other display device 1000 may be minimized. Accordingly, in the display device 1000, the tiling display device TD, and the method of manufacturing a tiling display device according to another exemplary aspect of the present disclosure, during the process of aligning a plurality of display devices 1000, the attractive force and the repulsive force between a display device 1000 to be aligned by the operator and a surrounding display device 1000 may be minimized. Therefore, the operator may align the display device 1000 without being interfered with the magnetic force between the plurality of panel magnets 1030 of the display devices 1000 which are adjacent to each other.

Figure 11:
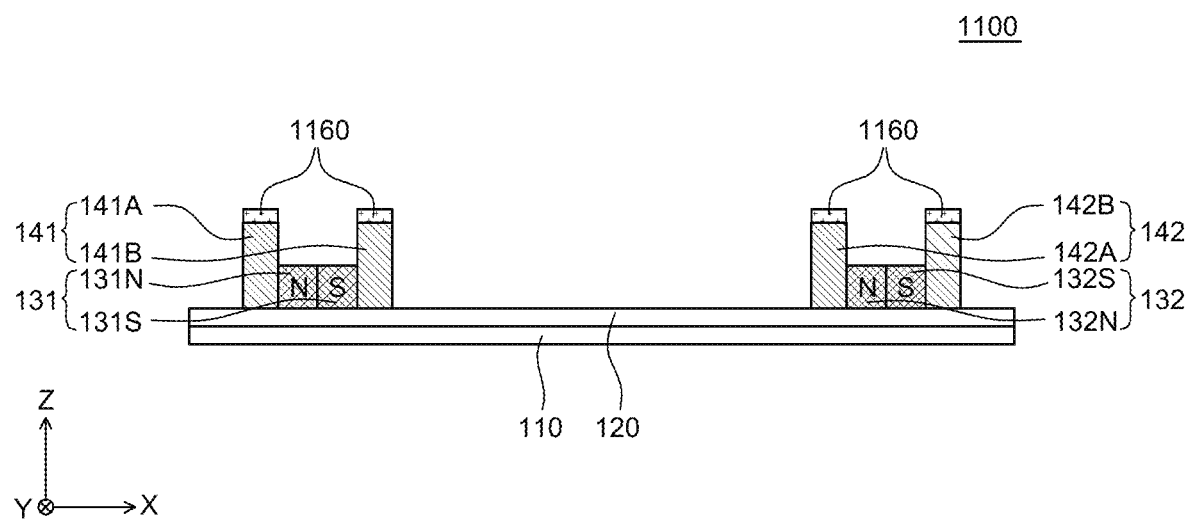
FIG. 11 is a cross-sectional view of a display device according to still another exemplary aspect of the present disclosure.

FIG. 11 is a cross-sectional view of a display device according to still another exemplary aspect of the present disclosure. As compared with the display device 100 described with reference to FIGS. 1 to 6F, a display device 1100 of FIG. 11 further includes a plurality of pads 1160, but other components are substantially the same. Therefore, a redundant description will be omitted.

Referring to FIG. 11, a plurality of pads 1160 is disposed at ends of the plurality of panel ferromagnetic materials 140. Specifically, one ends of the plurality of panel ferromagnetic materials 140 may be in contact with the rear surface of the metal plate 120 and the other ends may be in contact with the plurality of pads 1160. Therefore, the plurality of pads 1160 may be disposed in the first portion 141A and the second portion 141B of the first panel ferromagnetic material 141 and the first portion 142A and the second portion 142B of the second panel ferromagnetic material 142. Further, even though not illustrated in FIG. 11, the plurality of pads 1160 may be disposed in the first portion 143A and the second portion 143B of the third panel ferromagnetic material 143 and the first portion 144A and the second portion 144B of the fourth panel ferromagnetic material 144.

The plurality of pads 1160 may minimize the rapid slippage of the display device 1100 on the wall portion 200 during the process of aligning the display device 1100. Therefore, the plurality of pads 1160 may be formed of a material having a deviation between a static frictional coefficient and a kinetic frictional coefficient of the plurality of pads 1160 which is smaller than a deviation between a static frictional coefficient and a kinetic frictional coefficient of the plurality of panel ferromagnetic materials 140. For example, when the plurality of panel ferromagnetic materials 140 is formed of steel, the plurality of pads 1160 may be formed of a material having a deviation between a static frictional coefficient and a kinetic frictional coefficient of the plurality of pads 1160 which is smaller than that of the plurality of panel ferromagnetic materials 140, such as silicon.

In the display device 1100, the tiling display device TD, and the method of manufacturing a tiling display device according to another exemplary aspect of the present disclosure, the plurality of pads 1160 is disposed at ends of the plurality of panel ferromagnetic materials 140 to more precisely align the display device 1100. When the deviation between a static frictional coefficient and a kinetic frictional coefficient is large, like the panel ferromagnetic material 140 of the display device 1100 which is in contact with the wall portion 200, during the process of aligning the display devices 1100, the display devices 1100 may rapidly slip.

Specifically, the static frictional coefficient of all materials is higher than the kinetic frictional coefficient. Therefore, regardless of the component of the display device 1100 which is in contact with the wall portion 200, at the first moment that the display device 1100 is aligned, the operator may apply relatively strong force to move the display device 1100 on the wall portion 200. Only, when a component of the display device 1100 which are in contact with the wall portion 200, for example, the plurality of panel ferromagnetic materials 140 has a large deviation between the static frictional coefficient and the kinetic frictional coefficient, the display device 1100 may be rapidly slip by the force which is initially applied by the operator. Therefore, the display device 1100 to be aligned by the operator and the adjacent display device 100 are strongly collided with each other to be damaged. Further, when the operator aligns the display devices 1100 with a smaller force to avoid the rapid slippage of the display device 1100, the operator cannot move the display device 1100 and cannot precisely align the display device 1100. Therefore, the display device 1100, the tiling display device TD, and the method of manufacturing a tiling display device according to another exemplary aspect of the present disclosure, the plurality of pads 1160 which is formed of a material having a deviation between the kinetic frictional coefficient and the static frictional coefficient smaller than that of the plurality of panel ferromagnetic materials 140 is disposed at the ends of the plurality of panel ferromagnetic materials 140. Therefore, the deviation between a force which is initially applied by the operator to move the display device 1100 and a force which is applied by the operator while moving the display device 1100 may be reduced. Therefore, during the process of aligning the display devices 1100, the operator may more precisely align the display device 1100. Further, the damage of the display device 1100 caused by the collision between the adjacent display devices 1100 during the process of aligning display devices 1100 may be reduced.

Figure 12A:
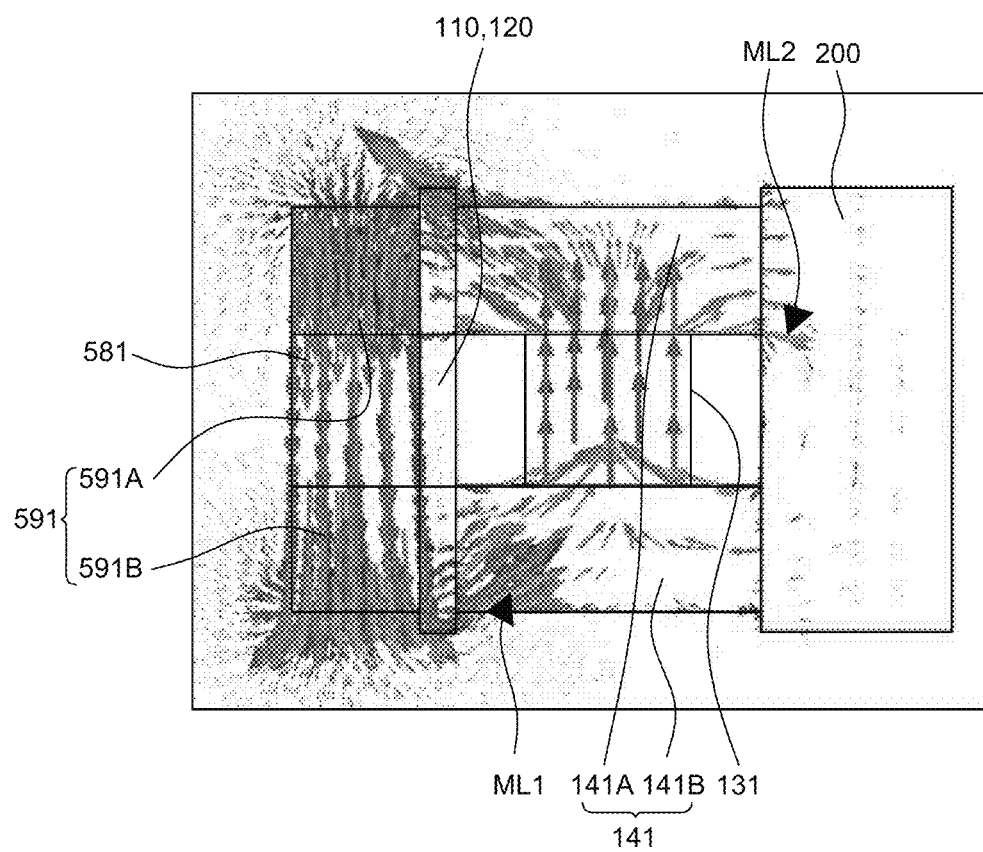
FIGS. 12A and 12B are images for explaining a magnetic field in a method of manufacturing a tiling display device according to an exemplary aspect of the present disclosure.
Figure 12B:
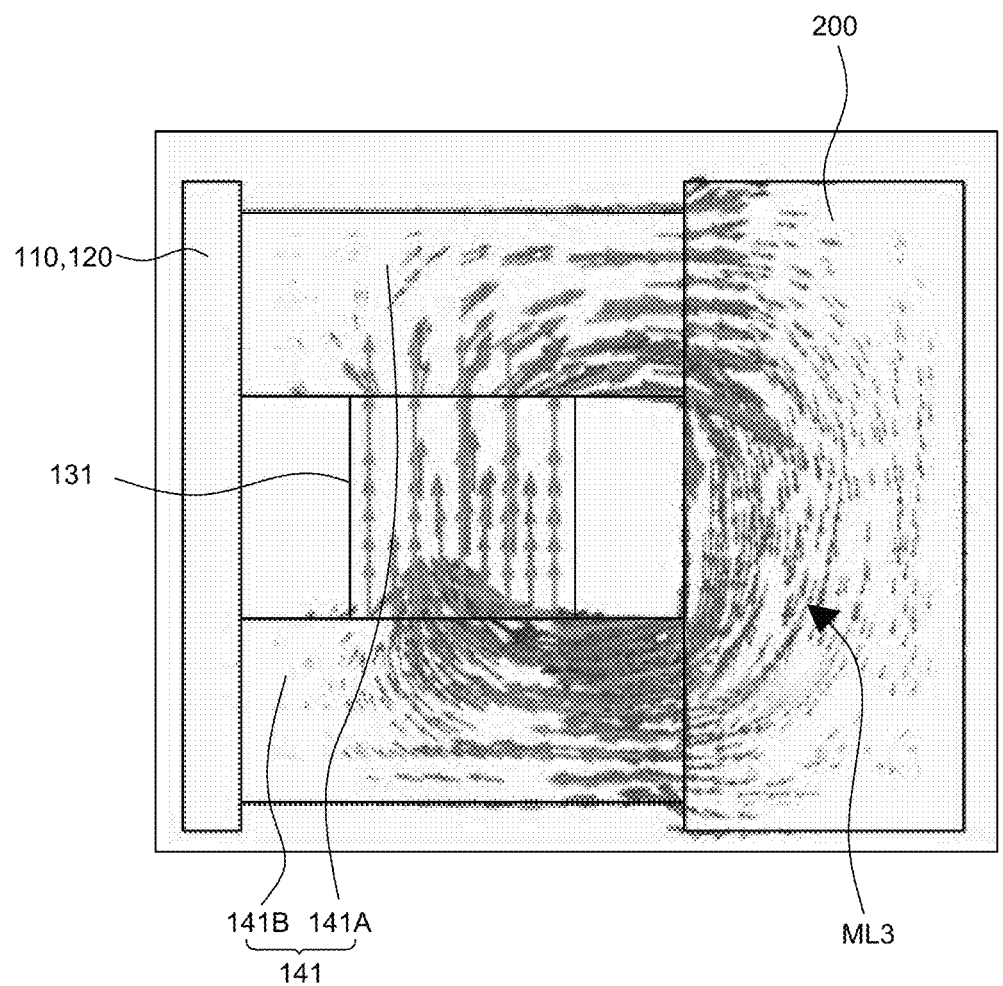

FIGS. 12A and 12B are images for explaining a magnetic field in a method of manufacturing a tiling display device according to an exemplary aspect of the present disclosure. FIG. 12A is an image obtained by simulating a magnetic line generated when a mounting jig 500 and the display device 100 are in contact with each other and the display device 100 and the wall portion 200 are in contact with each other during the process of manufacturing a tiling display device TD as illustrated in FIG. 6B. FIG. 12B is an image obtained by simulating a magnetic line generated when the mounting jig 500 is detached from the display device 100 after completing the alignment of the display device during the process of manufacturing the tiling display device TD as illustrated in FIG. 6C. In FIGS. 12A and 12B, for the convenience of description, a first panel magnet 131 among a plurality of panel magnets 130, a first panel ferromagnetic material 141 among a plurality of panel ferromagnetic materials 140, a first jig magnet 581 among a plurality of jig magnets 580, and a first jig ferromagnetic material 591 among a plurality of jig ferromagnetic materials 590 are schematically illustrated. Further, in the image, the higher the density of the magnetic line, the stronger the intensity of the magnetic line and the lower the density of the magnetic line, the weaker the intensity of the magnetic line.

At the time of simulation, it is assumed that the wall portion 200 is formed of steel and is a rectangular parallelepiped having a width, a length, and a height of 2.2 cm, 1 cm, and 3.2 cm. The display panel 110 and the metal plate 120 are a single rectangular parallelepiped formed of glass having a width, a length, and a height of 2.5 cm, 0.3 cm, and 3.5 cm. The first portion 141A and the second portion 141B of the first panel ferromagnetic material 141 are formed of steel and are rectangular parallelepipeds having a width, a length, and a height of 1.56 cm, 2.4 cm, and 1 cm. The first panel magnet 131 has a magnetic coercivity of 8.35E+5 A/m and is a rectangular parallelepiped having a width, a length, and a height of 1.5 cm, 1 cm, and 1.2 cm. The first portion 591A and the second portion 591B of the first jig ferromagnetic material 591 are formed of steel and are rectangular parallelepipeds having a width, a length, and a height of 1.56 cm, 0.9 cm, and 1 cm. The first jig magnet 581 has a magnetic coercivity of 8.35E+5 A/m and is a rectangular parallelepiped having a width, a length, and a height of 1.5 cm, 0.9 cm, and 1.2 cm. In FIGS. 12A and 12B, a cross-sectional image in a vertical direction is illustrated.

First, referring to FIG. 12A, in a state in which the display device 100 is brought into contact with the wall portion 200 using the mounting jig 500, the second magnetic line ML2 may be induced to the wall portion 200, the first panel ferromagnetic material 141, and the first panel magnet 131 and the first magnetic line ML1 may be induced to the first panel ferromagnetic material 141, the first panel magnet 131, the first jig ferromagnetic material 591, and the first jig magnet 581. In this case, the first magnetic line ML1 is stronger than the second magnetic line ML2 so that an attachment force between the display device 100 and the wall portion 200 is very low and approximately 17 N. Therefore, it is confirmed that the operator may easily move the display device 100 by moving the mounting jig 500.

Next, referring to FIG. 12B, as the mounting jig 500 is detached from the display device 100, the first magnetic line ML1 is removed and a third magnetic line ML3 which is stronger than the second magnetic line ML2 may be induced to the wall portion 200, the first panel ferromagnetic material 141, and the first panel magnet 131. In this case, since the third magnetic line ML3 is stronger than the second magnetic line ML2 and the mounting jig 500 is removed so that the first magnetic line ML1 formed on the front surface of the display device 100 is removed. Therefore, the attachment force between the display device 100 and the wall portion 200 may be very high, for example, approximately 115 N. Therefore, it is confirmed that when the mounting jig 500 is removed after completing the alignment of the display device 100, the display device 100 may be strongly fixed to the wall portion 200.

The display device, the tiling display device, and the manufacturing method of the tiling display device according to various exemplary aspects of the present disclosure will be described as follows.

The exemplary aspects of the present disclosure can also be described as follows:

According to an aspect of the present disclosure, there is provided a display device. The display device includes a display panel; a metal plate disposed on a rear surface of the display panel; a plurality of magnets disposed on a rear surface of the metal plate; and a plurality of ferromagnetic materials disposed on both side surfaces of the plurality of magnets.

Each of the plurality of ferromagnetic materials may include a first portion disposed to be in contact with N poles of the plurality of magnets and a second portion disposed to be in contact with S poles of the plurality of magnets.

The plurality of magnets may include a first magnet and a second magnet which is disposed in parallel to the first magnet in a first direction.

The plurality of magnets further may include a third magnet which is disposed in parallel to the first magnet in a second direction, and one of the first direction and the second direction is parallel to a long side of the display panel and the other one is parallel to a short side of the display panel.

An N pole of the first magnet may be disposed to be parallel to an N pole of the second magnet and an S pole of the first magnet is disposed to be parallel to an S pole of the second magnet.

An N pole of the first magnet may be disposed to be parallel to an S pole of the second magnet and an S pole of the first magnet is disposed to be parallel to an N pole of the second magnet.

The plurality of magnets may include a first magnet and a second magnet which is disposed in parallel to the first magnet in a third direction and the third direction is different from the short side and the long side of the display panel.

The plurality of ferromagnetic materials may be disposed on the rear surface of the metal plate and the plurality of magnets is disposed between one end of the plurality of ferromagnetic materials which is in contact with the rear surface of the metal plate and the other end of the plurality of ferromagnetic materials.

The display device may further comprise of a plurality of pads disposed at the other end of the plurality of ferromagnetic materials.

A deviation between a static frictional coefficient and a kinetic frictional coefficient of the plurality of pads may be smaller than a deviation between a static frictional coefficient and a kinetic frictional coefficient of the plurality of ferromagnetic materials.

The display device may further comprise of one or more frames disposed to be adjacent to an edge of the metal plate, on a rear surface of the metal plate.

The frame may be disposed between the plurality of magnets and the metal plate.

The display device may further comprise of a flexible film or a printed circuit board which is electrically connected to a non-active area of the display panel.

The plurality of magnets and the plurality of ferromagnetic materials may be disposed so as not to overlap the flexible film and the printed circuit board.

According to an aspect of the present disclosure, a tiling display device in which a plurality of display devices may be disposed is provided.

According to another aspect of the present disclosure, a method of manufacturing a tiling display device includes: attaching a mounting jig including a plurality of jig magnets to a display device including a plurality of panel magnets and a plurality of panel ferromagnetic materials; bring the display device into contact with a wall portion using the mounting jig; and detaching the mounting jig from the display device.

The mounting jig may further include a plurality of jig ferromagnetic materials including a first portion disposed to be in contact with an N pole of the plurality of jig magnets and a second portion disposed to be in contact with an S pole of the plurality of jig magnets.

The attaching of a mounting jig may include attaching the mounting jig such that the plurality of panel magnets corresponds to the plurality of jig magnets and the plurality of panel ferromagnetic materials corresponds to the plurality of jig ferromagnetic materials.

The polarities of a part of the plurality of panel magnet and a part of the plurality of jig magnets corresponding to each other may be opposite to each other.

Each of the plurality of panel ferromagnetic materials may include a first portion disposed to be in contact with N poles of the plurality of panel magnets and a second portion disposed to be in contact with S poles of the plurality of panel magnets.

In the bringing of the display device into contact with a wall portion, an intensity of a first magnetic line generated between the display device and the mounting jig may be stronger than an intensity of a second magnetic line generated between the display device and the wall portion.

The first magnetic line may be induced by the plurality of panel magnets, the plurality of panel ferromagnetic materials, the plurality of jig magnets, and the plurality of jig ferromagnetic materials and the second magnetic line is induced by the plurality of panel magnets, the plurality of panel ferromagnetic materials, and the wall portion.

In the detaching of the mounting jig from the display device, an intensity of a third magnetic line generated between the display device and the wall portion may be stronger than an intensity of the second magnetic line.

The method of manufacturing a tiling display device may further comprise of after the bringing of the display device into contact with the wall portion, moving the display device on the wall portion by the difference of the intensities of the first magnetic line and the second magnetic line.

The display device may further include a plurality of pads disposed at ends of the plurality of panel ferromagnetic materials and a deviation between a static frictional coefficient and a kinetic frictional coefficient of the plurality of pads is smaller than a deviation between a static frictional coefficient and a kinetic frictional coefficient of the plurality of ferromagnetic materials.

The wall portion may have a plate shape formed of a metal material.

According to another aspect of the present disclosure, a tiling display device includes: a wall portion; a plurality of display panels attached on the wall portion and electrically connected with one another; a metal plate disposed on a rear side of the plurality of display panels; a plurality of magnets disposed on a rear side of the metal plate; and a plurality of ferromagnetic materials disposed on both sides of each of the plurality of magnets.

Each of the plurality of ferromagnetic materials may include a first portion disposed to be in contact with N poles of the plurality of magnets and a second portion disposed to be in contact with S poles of the plurality of magnets. The plurality of magnets may include a first magnet and a second magnet disposed in parallel to the first magnet in a first direction.

The plurality of magnets may further include a third magnet which is disposed in parallel to the first magnet in a second direction, and one of the first direction and the second direction is parallel to a long side of the display panel and the other one of the first direction and the second direction is parallel to a short side of the display panel.

An N pole of the first magnet may be disposed to be parallel to an N pole of the second magnet and an S pole of the first magnet may be disposed to be parallel to an S pole of the second magnet.

An N pole of the first magnet may be disposed to be parallel to an S pole of the second magnet and an S pole of the first magnet may be disposed to be parallel to an N pole of the second magnet.

The plurality of magnets may include a first magnet and a second magnet disposed in parallel to the first magnet in a third direction and the third direction is not in parallel to the short side of the display panel or in parallel to the long side of the display panel.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel;
    a metal plate disposed on a rear side of the display panel;
    a plurality of magnets disposed on a rear side of the metal plate; and
    a plurality of ferromagnetic materials disposed on both sides of each of the plurality of magnets,
    wherein the metal plate is disposed between the display panel and the plurality of magnets,
    wherein each of the plurality of ferromagnetic materials includes a first portion disposed to be in contact with N poles of the plurality of magnets and a second portion disposed to be in contact with S poles of the plurality of magnets, and
    wherein the first portion, the N poles of the plurality of magnets, the S poles of the plurality of magnets and the second portion are sequentially disposed in parallel to the display panel.

2. The display device according to claim 1, wherein the plurality of magnets includes a first magnet and a second magnet disposed in parallel to the first magnet in a first direction.

3. The display device according to claim 2, wherein the plurality of magnets further includes a third magnet which is disposed in parallel to the first magnet in a second direction, and one of the first direction and the second direction is parallel to a long side of the display panel and the other one of the first direction and the second direction is parallel to a short side of the display panel.

4. The display device according to claim 2, wherein an N pole of the first magnet is disposed to be parallel to an N pole of the second magnet and an S pole of the first magnet is disposed to be parallel to an S pole of the second magnet.

5. The display device according to claim 2, wherein an N pole of the first magnet is disposed to be parallel to an S pole of the second magnet and an S pole of the first magnet is disposed to be parallel to an N pole of the second magnet.

6. The display device according to claim 1, wherein the plurality of magnets includes a first magnet and a second magnet disposed in parallel to the first magnet in a third direction and the third direction is not in parallel to the short side of the display panel or in parallel to the long side of the display panel.

7. The display device according to claim 1, wherein the plurality of ferromagnetic materials is disposed on the rear side of the metal plate and the plurality of magnets is disposed between one end of the plurality of ferromagnetic materials which is in contact with the rear side of the metal plate and the other end of the plurality of ferromagnetic materials.

8. The display device according to claim 7, further comprising a plurality of pads disposed at the other end of the plurality of ferromagnetic materials.

9. The display device according to claim 8, wherein a deviation between a static frictional coefficient and a kinetic frictional coefficient of the plurality of pads is smaller than a deviation between a static frictional coefficient and a kinetic frictional coefficient of the plurality of ferromagnetic materials.

10. The display device according to claim 1, further comprising one or more frames disposed to be adjacent to an edge of the metal plate, on a rear side of the metal plate.

11. The display device according to claim 10, wherein the frame is disposed between the plurality of magnets and the metal plate.

12. The display device according to claim 1, further comprising a flexible film or a printed circuit board which is electrically connected to a non-active area of the display panel,
    wherein the plurality of magnets and the plurality of ferromagnetic materials are disposed so as not to overlap the flexible film and the printed circuit board.

13. A tiling display device, comprising:
    a wall portion;
    a plurality of display panels attached on the wall portion and electrically connected with one another;
    a metal plate disposed on a rear side of the plurality of display panels;
    a plurality of magnets disposed on a rear side of the metal plate; and
    a plurality of ferromagnetic materials disposed on both sides of each of the plurality of magnets,
    wherein the metal plate is disposed between the display panel and the plurality of magnets,
    wherein each of the plurality of ferromagnetic materials includes a first portion disposed to be in contact with N poles of the plurality of magnets and a second portion disposed to be in contact with S poles of the plurality of magnets, and
    wherein the first portion, the N poles of the plurality of magnets, the S poles of the plurality of magnets and the second portion are sequentially disposed in parallel to the display panel.

14. The tiling display device according to claim 13, wherein the plurality of magnets includes a first magnet and a second magnet disposed in parallel to the first magnet in a first direction.

15. The tiling display device according to claim 14, wherein the plurality of magnets further includes a third magnet which is disposed in parallel to the first magnet in a second direction, and one of the first direction and the second direction is parallel to a long side of the display panel and the other one of the first direction and the second direction is parallel to a short side of the display panel.

16. The tiling display device according to claim 14, wherein an N pole of the first magnet is disposed to be parallel to an N pole of the second magnet and an S pole of the first magnet is disposed to be parallel to an S pole of the second magnet.

17. The tiling display device according to claim 14, wherein an N pole of the first magnet is disposed to be parallel to an S pole of the second magnet and an S pole of the first magnet is disposed to be parallel to an N pole of the second magnet.

18. The tiling display device according to claim 13, wherein the plurality of magnets includes a first magnet and a second magnet disposed in parallel to the first magnet in a third direction and the third direction is not in parallel to the short side of the display panel or in parallel to the long side of the display panel.

\* \* \* \* \*